United States Patent
Nagai et al.

(10) Patent No.: US 11,553,588 B2
(45) Date of Patent: Jan. 10, 2023

(54) TRANSMISSION LINE BOARD, AND JOINT STRUCTURE OF TRANSMISSION LINE BOARD

(71) Applicant: Murata Manufacturing Co., Ltd., Nagaokakyo (JP)

(72) Inventors: Tomohiro Nagai, Nagaokakyo (JP); Kazuhiro Yamaji, Nagaokakyo (JP); Shigeru Tago, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 205 days.

(21) Appl. No.: 17/173,226

(22) Filed: Feb. 11, 2021

(65) Prior Publication Data

US 2021/0168931 A1  Jun. 3, 2021

Related U.S. Application Data

(63) Continuation of application No. PCT/JP2019/032353, filed on Aug. 20, 2019.

(30) Foreign Application Priority Data

Aug. 22, 2018  (JP) .............................. JP2018-155303

(51) Int. Cl.
*H05K 1/02* (2006.01)
*H05K 1/03* (2006.01)
(Continued)

(52) U.S. Cl.
CPC ......... *H05K 1/0243* (2013.01); *H05K 1/0313* (2013.01); *H05K 1/095* (2013.01)

(58) Field of Classification Search
CPC .. H05K 1/0239; H05K 1/0243; H05K 1/0298; H05K 1/025; H05K 1/14; H05K 1/111; H05K 1/147; H01B 7/08
See application file for complete search history.

(56) References Cited

U.S. PATENT DOCUMENTS 8,928,139 B2 * 1/2015 Zhao ........................ H01L 23/48
257/728
10,772,204 B2 * 9/2020 Baba ........................ H05K 1/181
(Continued)

FOREIGN PATENT DOCUMENTS

JP  2007-043560 A  2/2007
JP  2010-068405 A  3/2010
(Continued)

OTHER PUBLICATIONS

Official Communication issued in International Patent Application No. PCT/JP2019/032353, dated Nov. 5, 2019.

*Primary Examiner* — Hoa C Nguyen
*Assistant Examiner* — Amol H Patel
(74) *Attorney, Agent, or Firm* — Keating & Bennett, LLP

(57) ABSTRACT

A transmission line board includes an insulating substrate including a first principal surface, first and second signal lines, first and second signal electrodes, which are provided at the insulating substrate. The first signal electrode is connected to the first signal line, and is connected by capacitive coupling to a different circuit board. The second signal electrode is connected to the second signal line, and is connected to the different circuit board via a conductive binder. The first signal line is provided to transmit a signal in a first frequency band, and the second signal line is provided to transmit a signal in a second frequency band lower than the first frequency band.

29 Claims, 18 Drawing Sheets

(51) Int. Cl.
  *H05K 1/09*  (2006.01)
  *H01B 7/00*  (2006.01)
  *H01B 7/08*  (2006.01)

(56) References Cited

U.S. PATENT DOCUMENTS

| | | | |
|---|---|---|---|
| 2003/0100200 A1* | 5/2003 | Franzon | H01L 23/645 257/E23.01 |
| 2005/0077546 A1* | 4/2005 | Neaves | H01L 24/81 257/E23.079 |
| 2016/0372811 A1* | 12/2016 | Yosui | H05K 1/18 |
| 2017/0194076 A1* | 7/2017 | Yosui | H05K 1/0219 |
| 2018/0084637 A1* | 3/2018 | Ueda | H05K 1/0219 |
| 2019/0088388 A1* | 3/2019 | Baba | H01P 3/08 |
| 2022/0102835 A1* | 3/2022 | Makurin | H01Q 1/52 |

FOREIGN PATENT DOCUMENTS

| | | |
|---|---|---|
| JP | 2018-046213 A | 3/2018 |
| WO | 2015/146448 A1 | 10/2015 |
| WO | 2016/056496 A1 | 4/2016 |
| WO | 2017/199930 A1 | 11/2017 |
| WO | 2018/003383 A1 | 1/2018 |

\* cited by examiner

TRANSMISSION LINE BOARD, AND JOINT STRUCTURE OF TRANSMISSION LINE BOARD

CROSS REFERENCE TO RELATED APPLICATIONS

This application claims the benefit of priority to Japanese Patent Application No. 2018-155303 filed on Aug. 22, 2018 and is a Continuation Application of PCT Application No. PCT/JP2019/032353 filed on Aug. 20, 2019. The entire contents of each application are hereby incorporated herein by reference.

BACKGROUND OF THE INVENTION

1. Field of the Invention

The present invention relates to a transmission line board including an insulating substrate provided with a plurality of transmission lines, and a joint structure of the transmission line board.

2. Description of the Related Art

There has been conventionally known a transmission line board including an insulating substrate provided with a plurality of transmission lines.

For example, WO 2017/199930 A discloses a transmission line board including an insulating substrate having a plurality of substrate layers, and a plurality of conductor patterns (a first signal line, a second signal line, a first ground conductor, a second ground conductor, a third ground conductor, and a fourth ground conductor) provided at the insulating substrate. The transmission line board has a first transmission line including the first signal line, and the first ground conductor and the third ground conductor interposing the first signal line in a stacking direction, and a second transmission line including the second signal line, and the second ground conductor and the fourth ground conductor interposing the second signal line in a stacking direction. The transmission line board is connected to a different circuit board via a conductive binder, such as solder.

Along with reduction in size and high integration of electronic devices in recent years, it has become difficult to secure, in a case of an electronic device, a sufficient space for providing transmission lines and the like. A transmission line board may thus include a plurality of transmission lines provided for a single system, as well as for a different system.

When the transmission line board is connected to a circuit board with a conductive binder, a variation in the quantity of the conductive binder may lead to an unstable joining state with impedance change at a connection portion of a first transmission line provided for a high frequency band. This is more significant when the transmission line is used for a high frequency.

SUMMARY OF THE INVENTION

Preferred embodiments of the present invention provide transmission line boards each including a first signal line for a first frequency band, and a second signal line for a second frequency band lower than the first frequency band, in which impedance mismatching is reduced or prevented at a connection portion of a transmission line including the first signal line.

A transmission line board according to a preferred embodiment of the present invention includes an insulating substrate including a first principal surface; a first signal line and at least one second signal line provided at the insulating substrate; a first signal electrode provided at the insulating substrate, connected to the first signal line, and connected by capacitive coupling to a different circuit board; and a second signal electrode provided at the first principal surface, connected to the second signal line, and connected to the different circuit board via a conductive binder. The first signal line is provided to transmit a signal in a first frequency band, and the second signal line is provided to transmit a signal in a second frequency band lower than the first frequency band.

A joint structure of a transmission line board according to a preferred embodiment of the present invention includes a transmission line board and a circuit board joined to each other with a conductive binder interposed therebetween, in which the transmission line board includes an insulating substrate including a first principal surface, a first signal line and at least one second signal line provided at the insulating substrate, a first signal electrode provided at the insulating substrate and connected to the first signal line, and a second signal electrode provided at the first principal surface and connected to the second signal line, the first signal line is provided to transmit a signal in a first frequency band, the second signal line is provided to transmit a signal in a second frequency band lower than the first frequency band, the first signal electrode is connected by capacitive coupling to the circuit board, and the second signal electrode is connected directly to the circuit board via a conductive binder.

When the transmission line board is connected to the circuit board via a conductive binder, a variation in the quantity of the conductive binder may lead to an unstable joining state with impedance mismatching at a connection portion of a transmission line. This configuration enables connection of a first transmission line to a different circuit board with no influence of a variation in joining state due to the quantity of the conductive binder, to reduce or prevent impedance mismatching at a connection portion of the first transmission line.

Preferred embodiments of the present invention provide transmission line boards each including a first signal line for a first frequency band, and a second signal line for a second frequency band lower than the first frequency band, in which impedance mismatching is reduced or prevented at a connection portion of a transmission line including the first signal line.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
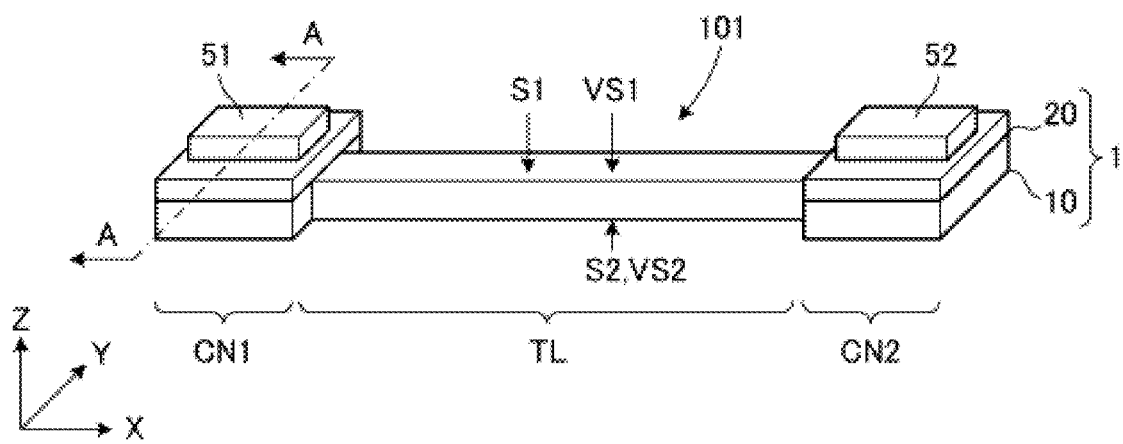
FIG. 1A is a perspective view of a connector-equipped cable 301 according to a first preferred embodiment of the present invention.

Several specific examples will be described hereinafter with reference to the drawings to exemplify a plurality of preferred embodiments of the present invention. The same or corresponding portions in the drawings are denoted by the same reference symbols. The preferred embodiments will be provided separately for convenience of easier description or comprehension of points, but can each be replaced or combined with a portion of any configuration exemplified in any different preferred embodiment. Second and subsequent preferred embodiments will be described only with reference to differences from the first preferred embodiment, without referring to matters in common with those according to the first preferred embodiment. In particular, the same or similar advantageous functions and effects achieved in similar configurations will not be described in each of the preferred embodiments.

First Preferred Embodiment

Figure 1B:
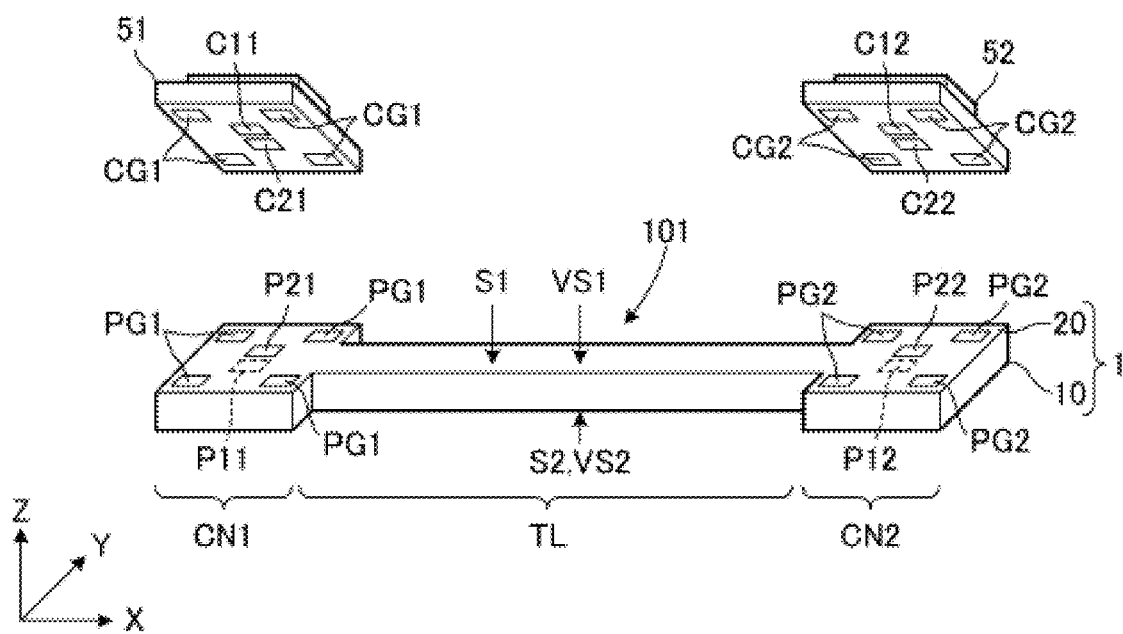
FIG. 1B is a perspective view of the connector-equipped cable 301 with connectors 51 and 52 being detached.
Figure 2:
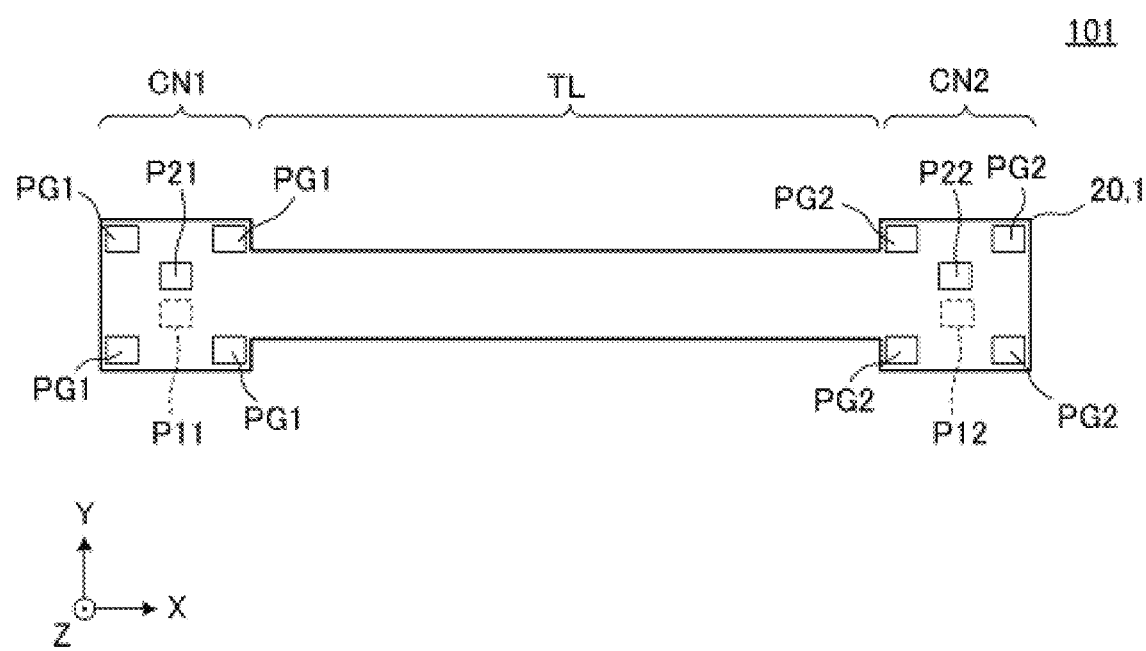
FIG. 2 is a plan view of a transmission line board 101 according to the first preferred embodiment of the present invention.
Figure 3:
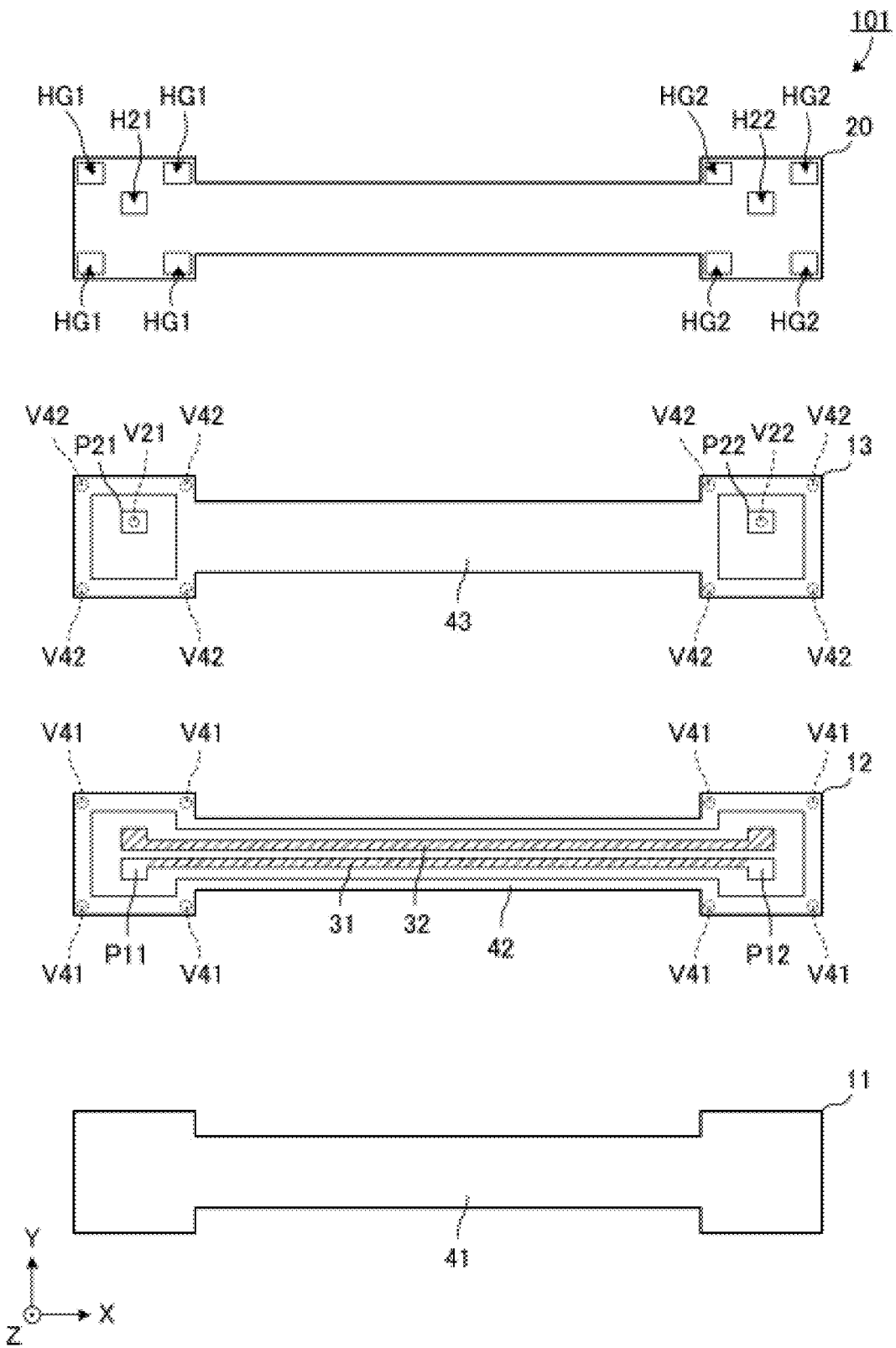
FIG. 3 is an exploded plan view of the transmission line board 101.
Figure 4:
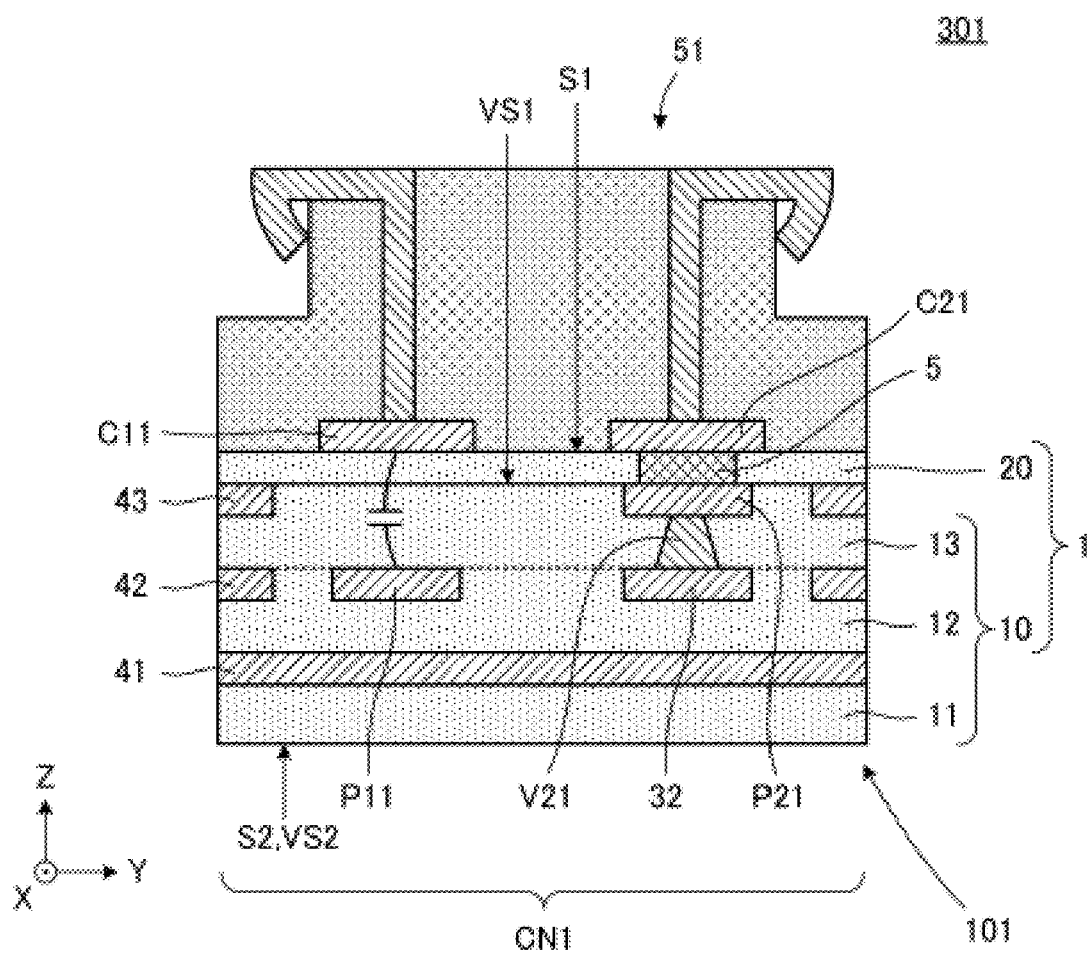
FIG. 4 is a sectional view taken along line A-A indicated in FIG. 1A.

FIG. 1A is a perspective view of a connector-equipped cable 301 according to a first preferred embodiment of the present invention, and FIG. 1B is a perspective view of the connector-equipped cable 301 with connectors 51 and 52 being detached. FIG. 2 is a plan view of a transmission line board 101 according to the first preferred embodiment. FIG. 3 is an exploded plan view of the transmission line board 101. FIG. 4 is a sectional view taken along line A-A indicated in FIG. 1A. FIG. 3 shows a first signal line 31 and a second signal line 32 that are hatched for easier structure comprehension.

The connector-equipped cable 301 includes a transmission line board 101 and connectors 51 and 52. The transmission line board 101 according to the present preferred embodiment is exemplarily applied to a plurality of systems for different frequency bands, and defines and functions as a cable connecting a plurality of circuit boards. The transmission line board according to a preferred embodiment of the present invention may alternatively define and function as an electronic component mounted on a single circuit board (see "Sixth Preferred Embodiment").

Although not shown, the connector 51 is connected to a receptacle provided at a different circuit board (first circuit board), and the connector 52 is connected to receptacle provided at another different circuit board (second circuit board). In the present preferred embodiment, the connector 51 is a portion of the first circuit board, and the connector 52 is a portion of the second circuit board. That is, FIGS. 1A and 1B are views of a joint structure between the transmission line board 101 and different circuit boards.

The transmission line board 101 includes a first connection portion CN1, a second connection portion CN2, and a line portion TL. The first connection portion CN1 and the second connection portion CN2 are each connected to a different circuit board. As to be described below, the line portion TL includes a plurality of transmission lines having a stripline structure connecting the first connection portion CN1 and the second connection portion CN2. As shown in FIGS. 1A and 1B, the first connection portion CN1 and the second connection portion CN2 each have a width (width in a Y axis direction) larger than a width of the line portion TL.

The transmission line board 101 includes an element assembly 1, first signal electrodes P11 and P12, second signal electrodes P21 and P22, a plurality of ground electrodes PG1 and PG2, the first signal line 31, the second signal line 32, ground conductors 41 to 43, interlayer connection conductors V21 and V22, a plurality of ground interlayer connection conductors V41 and V42, and the like.

The element assembly 1 is a rectangular or substantially rectangular parallelepiped with a longitudinal direction extending in an X axis direction, and includes a first surface S1 and a second surface S2 opposing each other. The element assembly 1 is defined by a stack of an insulating substrate 10 and a protective layer 20.

The insulating substrate 10 is a rectangular or substantially rectangular flat plate with a longitudinal direction extending in the X axis direction, and includes a first principal surface VS1 and a second principal surface VS2 opposing each other. The insulating substrate 10 is the flat plate preferably mainly made of a liquid crystal polymer (LCP), polyether ether ketone (PEEK), or the like, for example. The second principal surface VS2 of the insulating substrate 10 faces the second surface S2 of the element assembly 1 in the present preferred embodiment.

The second signal electrodes P21 and P22 and the plurality of ground electrodes PG1 and PG2 are provided on the first principal surface VS1 of the insulating substrate 10. The first signal electrodes P11 and P12, the first signal line 31, the second signal line 32, the ground conductors 41 to 43, the interlayer connection conductors V21 and V22, and the plurality of ground interlayer connection conductors V41 and V42 are provided inside the insulating substrate 10.

As described below, the insulating substrate 10 is formed by stacking a plurality of substrate layers 11 to 13 each preferably mainly being made of a thermoplastic resin, for example, and hot pressing (collectively pressing) the plurality of stacked substrate layers 11 to 13. Each of the plurality of substrate layers 11 to 13 is a rectangular or substantially rectangular flat plate with a longitudinal direction extending in the X axis direction. Each of the plurality of substrate layers 11 to 13 is a sheet preferably mainly made of a liquid crystal polymer (LCP), polyether ether ketone (PEEK), or the like, for example.

The substrate layer 11 includes a surface provided with the ground conductor 41. The ground conductor 41 is defined by a conductor pattern provided on the entire or substantially the entire surface of the substrate layer 11. The ground conductor 41 is preferably defined by a conductor pattern of Cu foil or the like, for example.

The substrate layer 12 includes a surface provided with the first signal line 31, the second signal line 32, the first signal electrodes P11 and P12, and the ground conductor 42. The first signal line 31, the second signal line 32, the first signal electrodes P11 and P12, and the ground conductor 42 are preferably defined by conductor patterns of Cu foil or the like, for example.

The first signal line 31 and the second signal line 32 are defined by linear conductor patterns extending in parallel with each other in the X axis direction. The first signal line 31 is provided for transmission of a signal in a first frequency band, and defines at least a portion of a first transmission line (to be described below) for the first frequency band. The second signal line 32 is provided for transmission of a signal in a second frequency band lower than the first frequency band, and defines at least a portion of a second transmission line (to be described below) for the second frequency band. For example, the first frequency band corresponds to a frequency band for at least about 10 GHz (an SHF band or an EHF band), and the second frequency band corresponds to a frequency band for not more than about 10 GHz. The first signal line 31 (first transmission line) is applied to, for example, a fifth generation mobile communication system (5G) using a 28 GHz band or the like. The second signal line 32 (second transmission line) is applied to, for example, Wi-Fi (registered trademark) using a 5.8 GHz band or the like.

The first signal electrode P11 is defined by a rectangular or substantially rectangular conductor pattern disposed adjacent to a first end of the substrate layer 12 (a left end of the substrate layer 12 in FIG. 3). The first signal electrode P12 is defined by a conductor pattern disposed adjacent to a second end of the substrate layer 12 (a right end of the substrate layer 12 in FIG. 3). The first signal electrode P11 is connected to a first end of the first signal line 31 (a left end of the first signal line 31 in FIG. 3), and the first signal electrode P12 is connected to a second end of the first signal line 31 (a right end of the first signal line 31 in FIG. 3). The ground conductor 42 is defined by an annular conductor pattern provided along an outer periphery of the substrate layer 12.

The substrate layer 12 is provided with the plurality of ground interlayer connection conductors V41. The ground conductor 42 is connected to the ground conductor 41 via the plurality of ground interlayer connection conductors V41. Examples of the ground interlayer connection conductors V41 include a via conductor formed by filling a through hole provided in the substrate layer 12 with conductive paste and solidifying the conductive paste through hot press treatment.

The substrate layer 13 includes a surface provided with the second signal electrodes P21 and P22 and the ground conductor 43. The second signal electrode P21 is defined by a rectangular or substantially rectangular conductor pattern disposed adjacent to a first end of the substrate layer 13 (a left end of the substrate layer 13 in FIG. 3).

The second signal electrode P22 is defined by a rectangular or substantially rectangular conductor pattern disposed adjacent to a second end of the substrate layer 13 (a right end of the substrate layer 13 in FIG. 3). The ground conductor 43 is defined by a conductor pattern provided on the entire or substantially the entire surface of the substrate layer 13. The second signal electrodes P21 and P22 and the ground conductor 43 are preferably defined by conductor patterns of Cu foil or the like, for example.

The substrate layer 13 is provided with the interlayer connection conductors V21 and V22 and the plurality of ground interlayer connection conductors V42. The second signal electrode P21 is connected to a first end of the second signal line 32 (a left end of the second signal line 32 in FIG. 3) via the interlayer connection conductor V21. The second signal electrode P22 is connected to a second end of the second signal line 32 (a right end of the second signal line 32 in FIG. 3) via the interlayer connection conductor V22. The ground conductor 43 is connected to the ground conductor 42 via the plurality of ground interlayer connection conductors V42. Examples of the interlayer connection conductors V21 and V22 and the ground interlayer connection conductors V42 include a via conductor formed by filling a through hole provided in the substrate layer 12 with conductive paste and solidifying the conductive paste through hot press treatment.

The protective layer 20 is a protective film stacked on the surface of the substrate layer 13 (the first principal surface VS1 of the insulating substrate 10), and has the same or substantially the same planar shape as the substrate layer 13. The protective layer 20 includes openings H21, H22, HG1, and HG2. The opening H21 positionally corresponds to the second signal electrode P21, and the opening H22 positionally corresponds to the second signal electrode P22. When the protective layer 20 is provided on the surface of the substrate layer 13, the second signal electrodes P21 and P22 are exposed outside via the openings. A plurality of openings HG1 are provided adjacent to a first end of the protective layer 20 (a left end of the protective layer 20 in FIG. 3), and a plurality of openings HG2 are provided adjacent to a second end of the protective layer 20 (a right end of the protective layer 20 in FIG. 3). When the protective layer 20 is provided on the surface of the substrate layer 13, a portion of the ground conductor 43 is exposed outside via the openings HG1 and HG2. In the present preferred embodiment, a portion of the ground conductor 43 exposed through the openings HG1 and HG2 corresponds to the "ground electrodes (PG1 and PG2)". Examples of the protective layer 20 include a cover lay film, a solder resist film, and an epoxy resin film.

The connector 51 is mounted on the first surface S1 of the first connection portion CN1. As shown in FIG. 1B, the connector 51 includes a mount surface (lower surface) provided with (exposing) a first connection electrode C11, a second connection electrode C21, and a plurality of ground connection electrodes CG1. As shown in FIG. 4 and the like, the first connection electrode C11 on the connector 51 is disposed opposite to the first signal electrode P11 and is capacitively coupled to the first signal electrode P11. The second connection electrode C21 on the connector 51 is connected to the second signal electrode P21 via a conductive binder 5. The ground connection electrodes CG1 on the connector 51 are each connected to a corresponding one of the ground electrodes PG1 via a conductive binder. The first signal electrode P11 accordingly is connected by capacitive coupling to the connector 51 (second circuit board). The second signal electrode P21 is connected to the connector 51 (second circuit board) via the conductive binder 5. Examples of the connector 51 include a multipolar connector (i.e., a connector including a plurality of inner terminals).

The connector 52 is mounted on the first surface S1 of the second connection portion CN2. As shown in FIG. 1B, the connector 52 includes a mount surface (lower surface) provided with (exposing) a first connection electrode C12, a second connection electrode C22, and a plurality of ground connection electrodes CG2. The first connection electrode C12 on the connector 52 is disposed opposite to the first signal electrode P12 and is capacitively coupled to the first signal electrode P12. The second connection electrode C22 on the connector 52 is connected to the second signal electrode P22 via a conductive binder. The ground connection electrodes CG2 on the connector 52 are each connected to a corresponding one of the ground electrodes PG2 via a conductive binder. The first signal electrode P12 is accordingly connected by capacitive coupling to the connector 52 (second circuit board). The second signal electrode P22 is connected to the connector 52 (second circuit board) via a conductive binder. Examples of the connector 52 include a multipolar connector.

The first signal line 31, the ground conductors 41 and 43, the substrate layer 12 interposed between the first signal line 31 and the ground conductor 41, and the substrate layer 13 interposed between the first signal line 31 and the ground conductor 43 define the first transmission line having the stripline structure in the present preferred embodiment. The second signal line 32, the ground conductors 41 and 43, the substrate layer 12 interposed between the second signal line 32 and the ground conductor 41, and the substrate layer 13 interposed between the second signal line 32 and the ground conductor 43 define the second transmission line having the stripline structure in the present preferred embodiment.

The first signal line 31 for the first frequency band is connected to the first signal electrodes P11 and P12 via no interlayer connection conductor in the present preferred embodiment.

As shown in FIG. 4 and the like, the first connection electrode C11 has a larger area than the first signal electrode P11 opposing the first connection electrode C11. Although not shown, the first connection electrode C12 has a larger area than the first signal electrode P12 opposing the first connection electrode C12.

As shown in FIG. 2, the plurality of ground electrodes PG1 surround the first signal electrode P11 and the second signal electrode P21 in a planar view of the first principal surface VS1 (when viewed in a Z axis direction). The plurality of ground electrodes PG2 surround the first signal electrode P12 and the second signal electrode P22 in the planar view of the first principal surface VS1.

As shown in FIG. 1B, FIG. 3, and the like, the first signal line 31, the second signal line 32, and the first signal electrodes P11 and P12 are not exposed outside. Specifically, the first signal line 31, the second signal line 32, and the entire first signal electrodes P11 and P12 are covered with the insulating substrate 10.

The connector-equipped cable 301 (transmission line board 101) according to the present preferred embodiment provides the following advantageous effects.

In the present preferred embodiment, the first signal electrodes P11 and P12 connected by capacitive coupling to the first signal line 31 are each connected to a different circuit board without a conductive binder. This configuration enables connection of the first transmission line to a different circuit board with no influence of variations in joining state due to the quantity of the conductive binder, so as to reduce or prevent impedance mismatching at a connection portion of the first transmission line.

In the present preferred embodiment, the second signal electrodes P21 and P22 connected to the second signal line 32 are each connected to a different circuit board not by capacitive coupling, but via a conductive binder. This configuration has a significant influence of a capacitance component on characteristic impedance in the second frequency band lower than the first frequency band, thus reducing or preventing impedance mismatching at a connection portion of the second transmission line that is not capacitively coupled. The second transmission line for the second frequency band lower than the first frequency band has less influence of an inductance component on characteristic impedance in comparison to the first transmission line, thus with less influence of variations in the quantity of the conductive binder on the characteristic impedance.

The interlayer connection conductors are each formed by filling a through hole with a conductor, and may thus be provided in a hole having a small inner diameter to reduce the quantity of the conductor filled in the through hole. The interlayer connection conductor may be provided by forming a plating film only on a wall of the through hole or may be formed with, as the conductor, a material (conductive paste) likely to be solidified at low temperature as in the present preferred embodiment, and is likely to have a higher resistance value than a planar conductor. The first signal line 31 and the first signal electrode P11 connected via a plurality of interlayer connection conductors may cause large conductor loss. In contrast, the first signal line 31 for the first frequency band higher than the second frequency band is connected to the first signal electrodes P11 and P12 via no interlayer connection conductor in the present preferred embodiment. This configuration enables a reduction in conductor loss as well as connection of the first signal line 31 to a different circuit board.

The first connection electrode C11 according to the present preferred embodiment has a larger area than the first signal electrode P11 capacitively coupled to the first connection electrode C11. This configuration reduces or prevents a change in capacitance generated between the first signal electrode P11 and the first connection electrode C11 even with variations in the positional relationship of the first connection electrode C11 opposing the first signal electrode P11 (a mounted position of the connector 51 relative to the element assembly 1). This configuration similarly reduces or prevents a change of the capacitance due to positional displacement (variations in the positional relationship between the first connection electrode and the first signal electrode) even when the first connection electrode C11 has a smaller area than the first signal electrode P11. The same applies to the relationship between the first signal electrode P12 and the first connection electrode C12.

When the insulating substrate 10 is formed by hot pressing (collectively pressing) the plurality of substrate layers 11 to 13 being stacked as in the present preferred embodiment, it is difficult for the insulating substrate 10 to have constant thickness and may have variations in the thickness thereof. With variations in the thickness of the insulating substrate 10 interposed between the first signal electrode P11 and the first connection electrode C11, the first signal electrode P11 and the first connection electrode C11 may have variations in capacitance therebetween. In the present preferred embodiment, the first signal electrode P11 and the first connection electrode C11 are capacitively coupled to each other with the protective layer 20 interposed therebetween and provided on the first principal surface VS1 of the insulating substrate 10. Even with some variations in capacitance between the first signal electrode P11 and the first connection electrode C11, the capacitance can thus be adjusted to a predetermined value by changing the thickness of and a material for the protective layer 20 provided on the first principal surface VS1 of the insulating substrate 10. The same applies to the relationship between the first signal electrode P12 and the first connection electrode C12.

In the present preferred embodiment, the plurality of ground electrodes PG1 surround the first signal electrode P11 and the second signal electrode P21 in a planar view of the first principal surface VS1 (when viewed in a Z axis direction). This configuration enables the connector 51 to be mounted on the transmission line board 101 (element assembly 1) with high positional accuracy. Specifically, the mounted position of the connector 51 is corrected by self-alignment caused at the plurality of ground electrodes PG1 and the second signal electrode P21 during a reflow process. This reduces or prevents a change in capacitance between the first signal electrode P11 and the first connection electrode C11 due to positional displacement, and prevents a poor joint between the second signal electrode P21 and the second connection electrode C21.

The plurality of ground electrodes PG1 surround the first signal electrode P11 and the second signal electrode P21 in this configuration, to reduce or prevent unnecessary radiation from a connection position between the first signal electrode P11 and the first connection electrode C11 by capacitive coupling and a connection position between the second signal electrode P21 and the second connection electrode C21 with the conductive binder 5 interposed therebetween. This configuration also reduces or prevents damage at a joint position between the second signal electrode P21 and the second connection electrode C21 by bending stress generated in an exemplary case where the element assembly 1 is bent.

In the present preferred embodiment, the plurality of ground electrodes PG2 surround the first signal electrode P12 and the second signal electrode P22 when viewed in the Z axis direction. This configuration enables the connector 52 to be mounted on the transmission line board 101 (element assembly 1) with high positional accuracy. Specifically, a mounted position of the connector 52 is corrected by self-alignment caused at the plurality of ground electrodes PG2 and the second signal electrode P22 during a reflow process. This can reduce or prevent a change in capacitance between the first signal electrode P12 and the first connection electrode C12, and can prevent poor joint between the second signal electrode P22 and the second connection electrode C22.

The plurality of ground electrodes PG2 surround the first signal electrode P12 and the second signal electrode P22 in this configuration, to reduce or prevent unnecessary radiation from a connection position between the first signal electrode P12 and the first connection electrode C12 by capacitive coupling and a connection position between the second signal electrode P22 and the second connection electrode C22 with the conductive binder interposed between. This configuration also reduces or prevents damage at a joint position between the second signal electrode P22 and the second connection electrode C22 by bending stress generated in the exemplary case where the element assembly 1 is bent.

In the present preferred embodiment, the first signal line 31, the second signal line 32, and the first signal electrodes P11 and P12 are not exposed outside. This configuration reduces or prevents corrosion and the like of a signal conductor by external moisture. This reduces or prevents characteristic changes of the transmission line board due to corrosion and the like of the signal conductor.

In the present preferred embodiment, the first signal line 31, the second signal line 32, and the entire or substantially the entire first signal electrodes P11 and P12 are covered with the insulating substrate 10 preferably mainly made of a liquid crystal polymer, for example. The liquid crystal polymer has a lower water absorbency than other resin materials. The above configuration accordingly further reduces or prevents corrosion and the like of the signal conductor by external moisture. Furthermore, the liquid crystal polymer has a higher high frequency characteristic (lower in dielectric loss) than other resin materials. The above configuration thus enables a transmission line board having less transmission loss.

The transmission line board 101 according to the present preferred embodiment may be produced through the following exemplary steps.

The plurality of substrate layers 11 to 13 are initially prepared. Each of the substrate layers 11 to 13 is a sheet preferably mainly made of a liquid crystal polymer (LCP) or a thermoplastic resin such as polyether ether ketone (PEEK), for example.

Thereafter, the first signal line 31, the second signal line 32, the ground conductors 41 to 43, the first signal electrodes P11 and P12, and the second signal electrodes P21 and P22 are formed at the plurality of substrate layers 11 to 13. Specifically, metal foil (e.g. Cu foil) is laminated on the surface of each of the substrate layers 11 to 13 and is patterned by photolithography, for example. Accordingly, the ground conductor 41 is formed on the surface of the substrate layer 11, the first signal line 31, the second signal line 32, the ground conductor 42, and the first signal electrodes P11 and P12 are formed on the surface of the substrate layer 12, and the second signal electrodes P21 and P22 and the ground conductor 43 are formed on the surface of the substrate layer 13.

Furthermore, the plurality of ground interlayer connection conductors V41 are formed on the substrate layer 12, and the interlayer connection conductors V21 and V22 and the plurality of ground interlayer connection conductors V42 are formed on the substrate layer 13. These interlayer connection conductors are each provided by forming a hole (through hole) in at least one of the plurality of substrate layer 12 and 13, then providing (filling) the hole with conductive paste preferably including, for example, a powdery metal of Cu, Sn, an alloy of any one of these metals, or the like and a resin material, and solidifying the conductive paste through subsequent hot pressing.

Subsequently, the plurality of substrate layers 11 to 13 are stacked and then hot pressed to form the insulating substrate 10.

The protective layer 20 is then formed on the first principal surface VS1 of the insulating substrate 10 to obtain the element assembly 1. The connectors 51 and 52 are thereafter mounted on the first surface S1 of the element assembly 1 to obtain the transmission line board 101.

The above example production method facilitates formation of the insulating substrate 10 through stacking the plurality of substrate layers 11 to 13 each preferably mainly made of a thermoplastic resin, for example, and hot pressing (collectively pressing) the substrate layers 11 to 13, and thus achieves a reduction in the number of production steps and a cost reduction.

The above example production method enables the conductive paste to be provided in the hole in the substrate layer and be solidified through hot pressing (collective pressing), to eliminate a step of forming the interlayer connection conductors.

Figure 5:
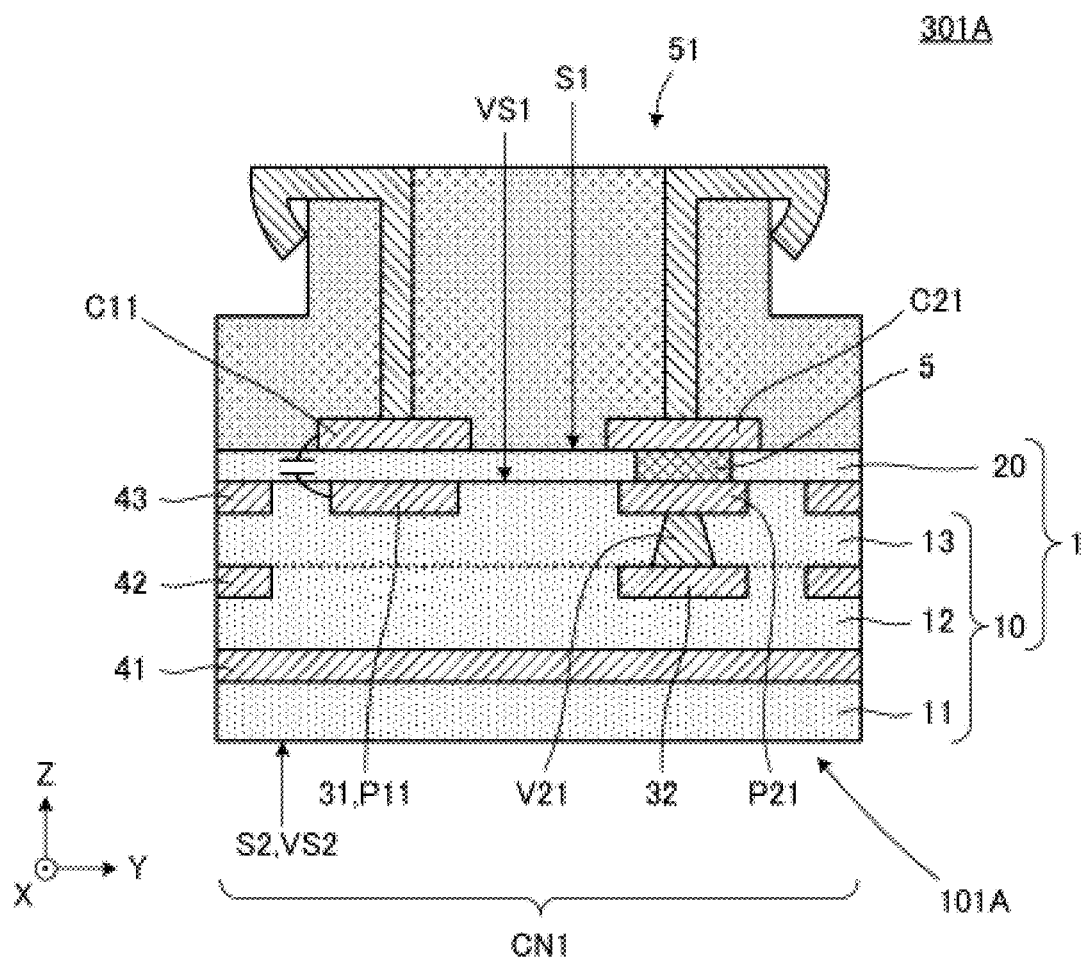
FIG. 5 is a sectional view of a first connection portion CN1 of a connector-equipped cable 301A according to a modified example of the first preferred embodiment of the present invention.

The present preferred embodiment exemplifies the case where the first signal line 31 and the second signal line 32 are provided at the same or substantially the same layer level (both on the surface of the substrate layer 12), but the present invention should not be limited to this configuration. The first signal line and the second signal line may alternatively be provided at layer levels different from each other. FIG. 5 is a sectional view of the first connection portion CN1 of a connector-equipped cable 301A according to a modified example of the first preferred embodiment.

The connector-equipped cable 301A is different from the connector-equipped cable 301 shown in FIG. 4 in that the connector-equipped cable 301A includes a transmission line board 101A. The connector-equipped cable 301A is configured the same as or similar to the connector-equipped cable 301 in the remaining portions. The transmission line board 101A is different from the transmission line board 101 in that the first signal line 31 (first signal electrode P11) is provided on the surface of the substrate layer 13. The first signal electrode P12 is provided on the surface of the substrate layer 13 also at the second connection portion CN2. The transmission line board 101A is configured the same as or similar to the transmission line board 101 in the remaining portions.

As in the transmission line board 101A, the first signal line 31 and the second signal line 32 may alternatively be provided at different layer levels (different positions in the Z axis direction) in order to, for example, increase in line width of the first signal line 31 and the second signal line 32 positioned at the line portion TL. When the first signal line 31 and the second signal line 32 are provided at different layer levels, the first signal line 31 is preferably disposed closer to the connector 51 than the second signal line 32. When the first signal line 31 is disposed closer to the connector 51 (first principal surface VS1), the first signal electrode P11 can be disposed close to the first connection electrode C11 at the connector 51 without providing any interlayer connection conductor. The first signal electrode P11 and the first connection electrode C11 can thus be easily provided therebetween with a predetermined capacitance (by, for example, adjusting the areas of the opposing electrodes) without an increase in parasitic inductance, and this leads to a transmission line board that enables impedance matching in a wide frequency band.

Second Preferred Embodiment

A second preferred embodiment of the present invention provides a connector-equipped cable including a cavity provided between the first signal electrode and the first connection electrode.

Figure 6A:
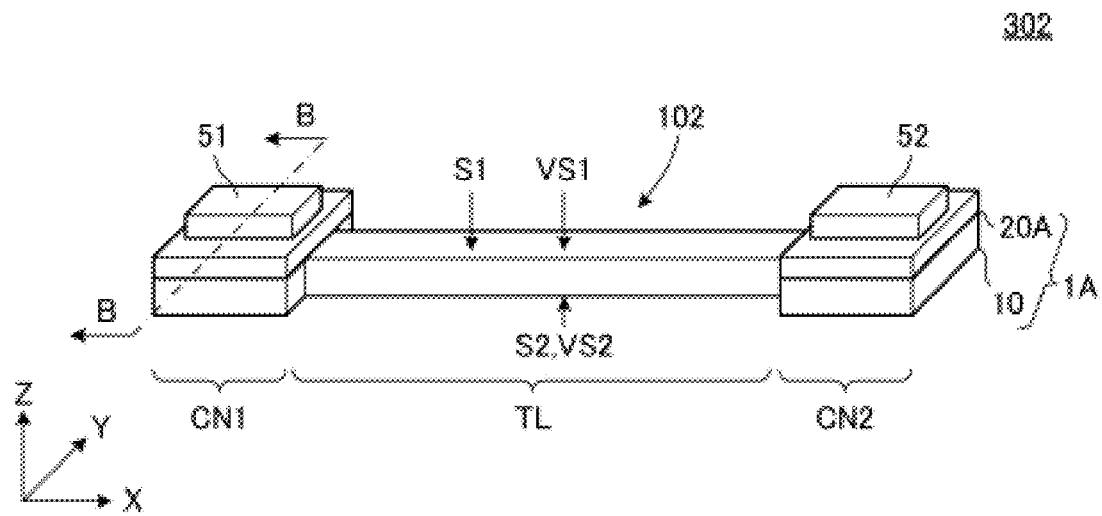
FIG. 6A is a perspective view of a connector-equipped cable 302 according to a second preferred embodiment of the present invention.
Figure 6B:
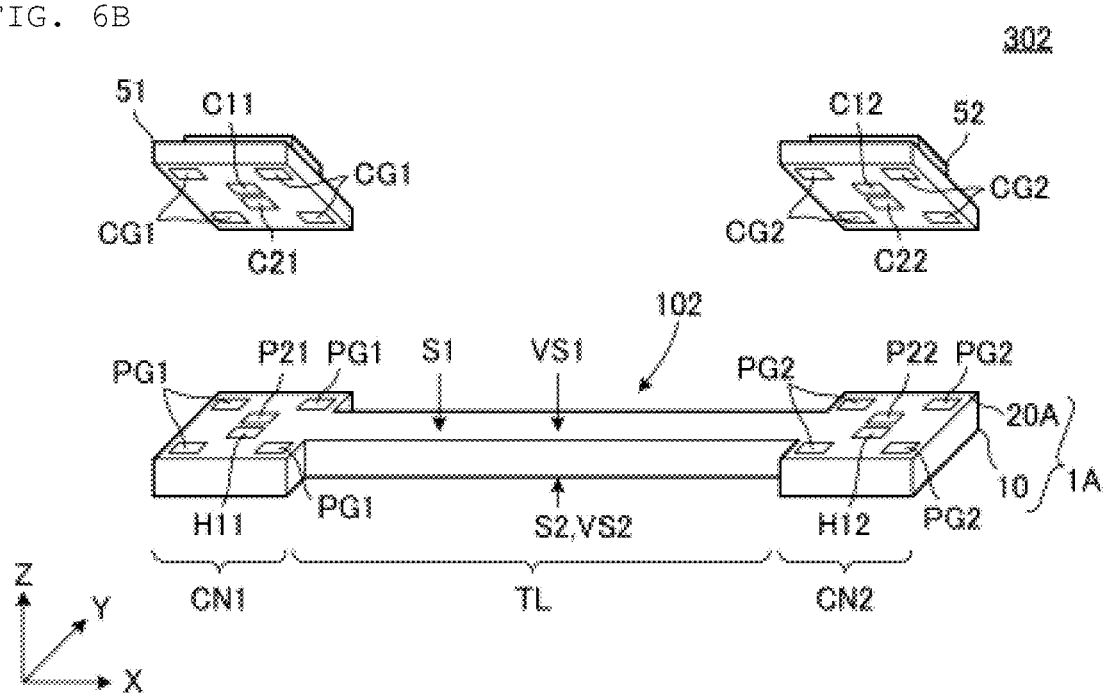
FIG. 6B is a perspective view of the connector-equipped cable 302 with the connectors 51 and 52 being detached.
Figure 7:
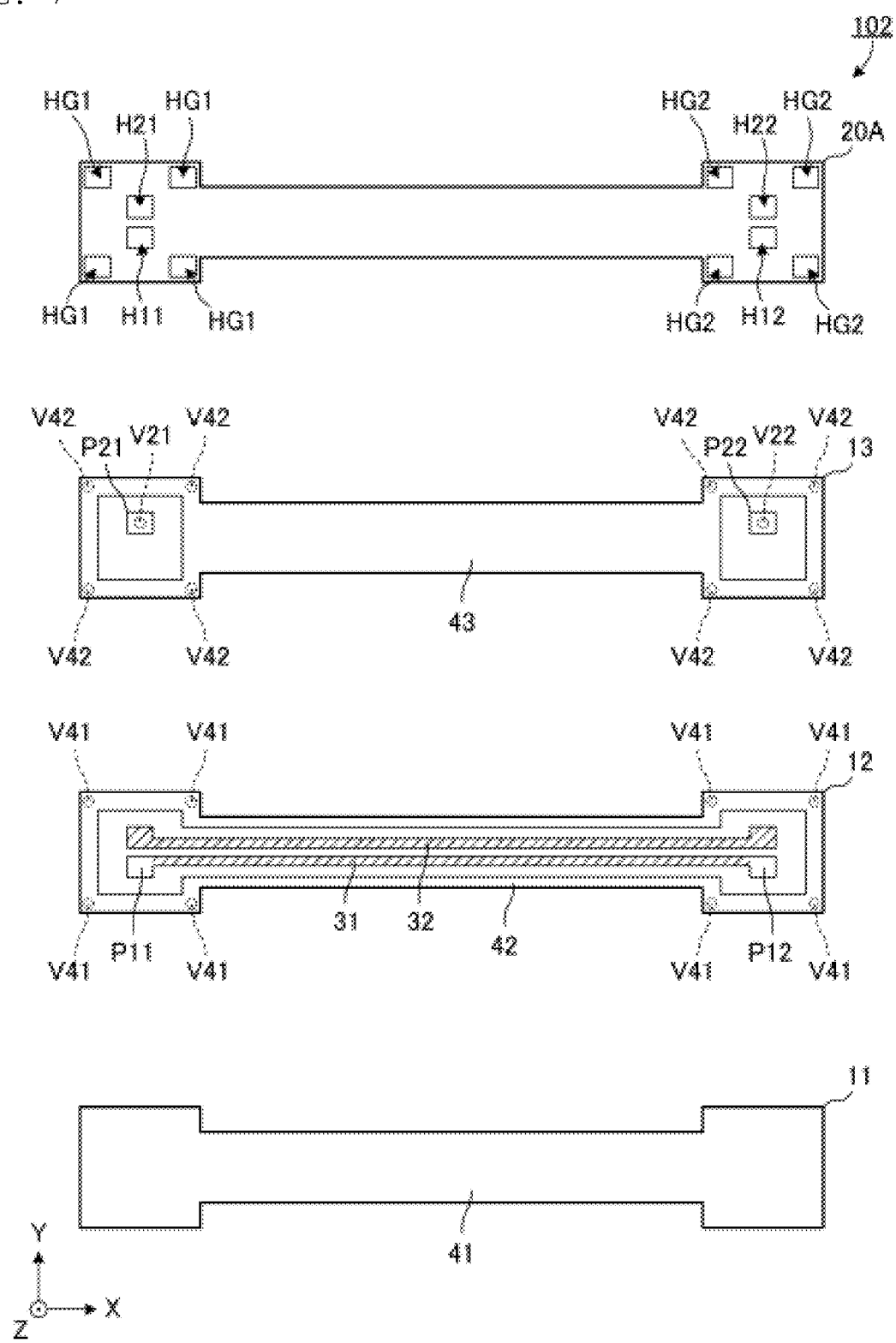
FIG. 7 is an exploded plan view of a transmission line board 102 according to the second preferred embodiment of the present invention.
Figure 8:
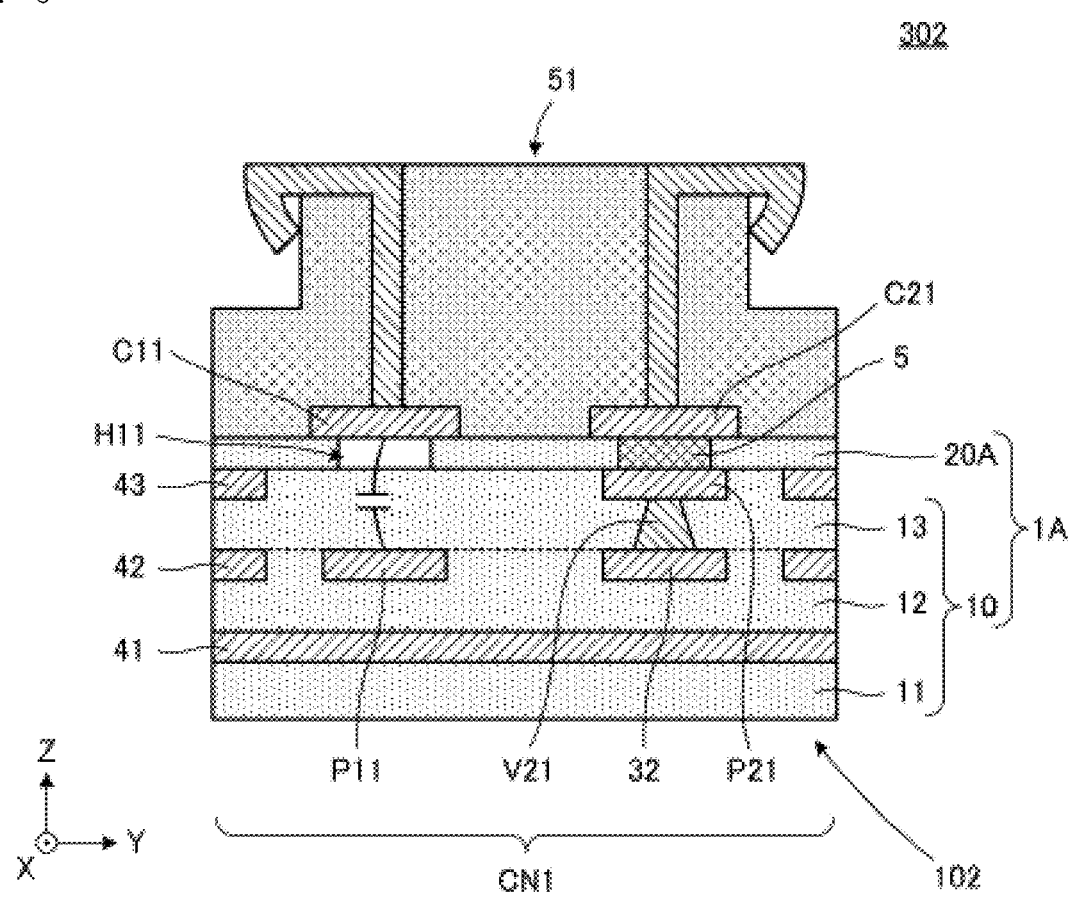
FIG. 8 is a sectional view taken along line B-B indicated in FIG. 6A.

FIG. 6A is a perspective view of a connector-equipped cable 302 according to the second preferred embodiment, and FIG. 6B is a perspective view of the connector-equipped cable 302 with the connectors 51 and 52 being detached. FIG. 7 is an exploded plan view of a transmission line board 102 according to the second preferred embodiment. FIG. 8 is a sectional view taken along line B-B indicated in FIG. 6A. FIG. 7 shows the first signal line 31 and the second signal line 32 that are hatched for easier structure comprehension.

The connector-equipped cable 302 is different from the connector-equipped cable 301 according to the first preferred embodiment in that the connector-equipped cable 302 includes the transmission line board 102. The transmission line board 102 is different from the transmission line board 101 according to the first preferred embodiment in that the transmission line board 102 includes a protective layer 20A. The protective layer 20A is different from the protective layer 20 according to the first preferred embodiment in that the protective layer 20A is provided with openings H11 and H12. The transmission line board 102 is configured the same or substantially the same as the transmission line board 101 in the remaining portions.

Description is provided below of differences from the transmission line board 101 according to the first preferred embodiment.

The opening H11 in the protective layer 20A positionally corresponds to the first signal electrode P11 in a planar view of the first principal surface VS1 (when viewed in the Z axis direction). The opening H12 positionally corresponds to the first signal electrode P12 when viewed in the Z axis direction. When the protective layer 20A is provided on the surface of the substrate layer 13 (the first principal surface VS1 of the insulating substrate 10), the first surface S1 of an element assembly 1A includes a recess.

As shown in FIG. 8, the first signal electrode P11 and the first connection electrode C11 interpose a cavity (a recess provided by the opening H11). Although not shown, the first signal electrode P12 and the first connection electrode C12 also interpose a cavity (the recess provided by the opening H12). Each of the cavities according to the present preferred embodiment corresponds to a "capacitance adjuster".

This configuration enables adjustment of capacitance between the first signal electrode and the first connection electrode by changing a thickness of or a material for the protective layer 20A, as well as a shape of the opening H11 or H12. In particular, the protective layer 20A (resist film) patterned by photolithography, for example, has high patterning accuracy to facilitate adjustment of capacitance between the first signal electrode and the first connection electrode.

Third Preferred Embodiment

A third preferred embodiment of the present invention exemplarily provides a connector-equipped cable including a connector including a first connection electrode not exposed outside.

Figure 9A:
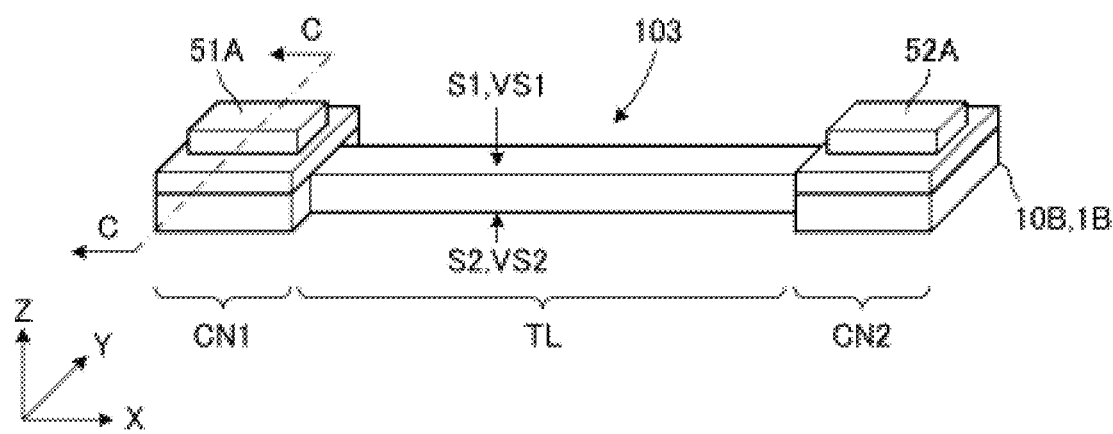
FIG. 9A is a perspective view of a connector-equipped cable 303 according to a third preferred embodiment of the present invention.
Figure 9B:
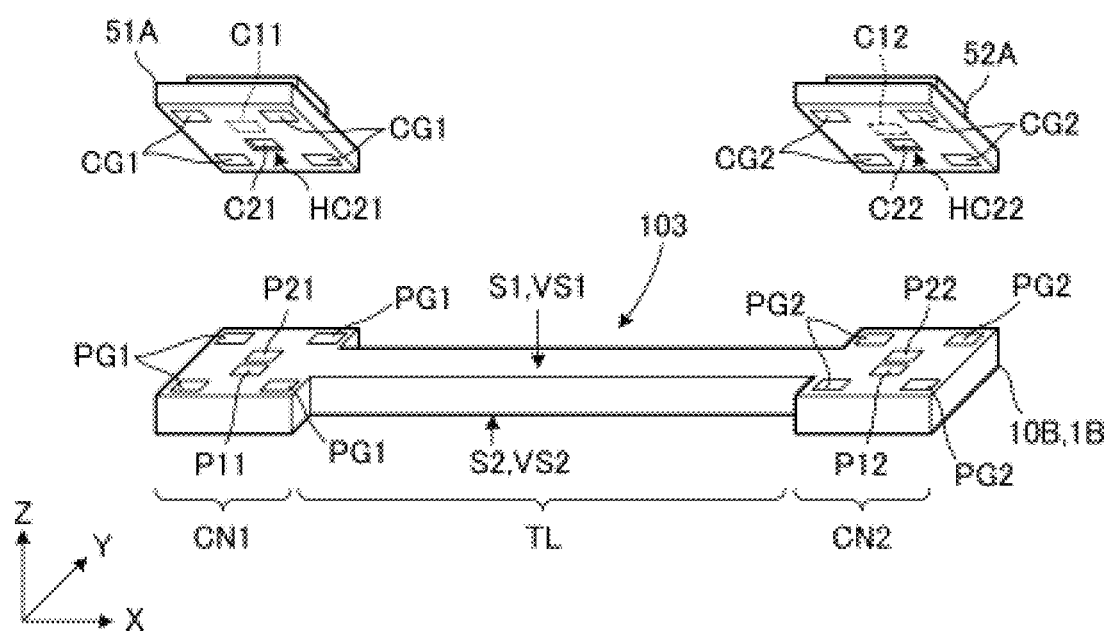
FIG. 9B is a perspective view of the connector-equipped cable 303 with connectors 51A and 52A being detached.
Figure 10:
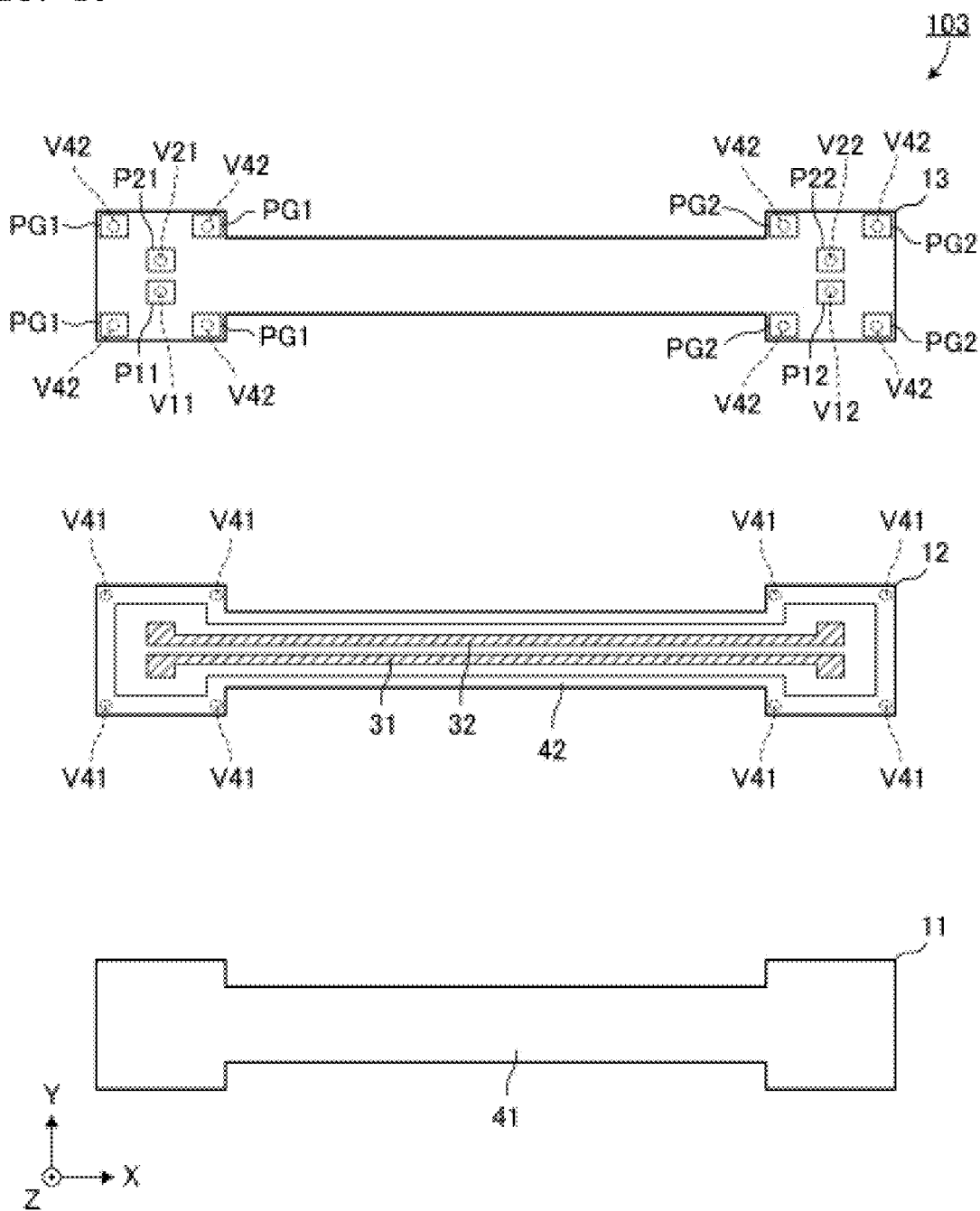
FIG. 10 is an exploded plan view of a transmission line board 103 according to the third preferred embodiment of the present invention.
Figure 11A:
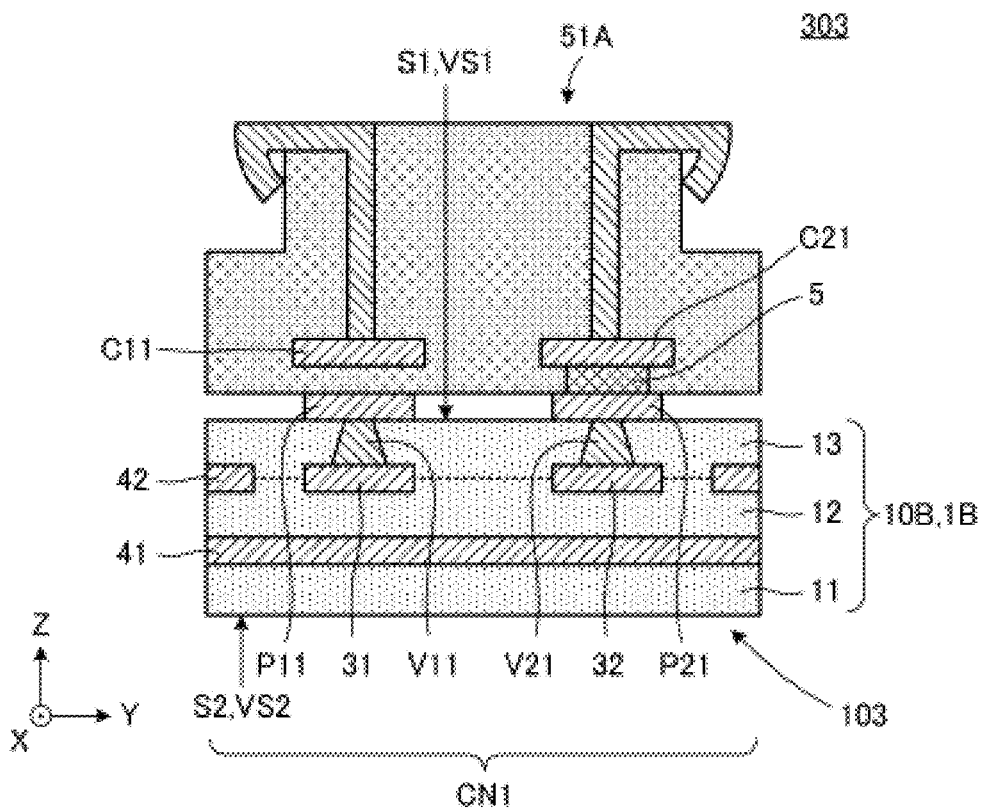
FIG. 11A is a sectional view taken along line C-C indicated in FIG. 9A.
Figure 11B:
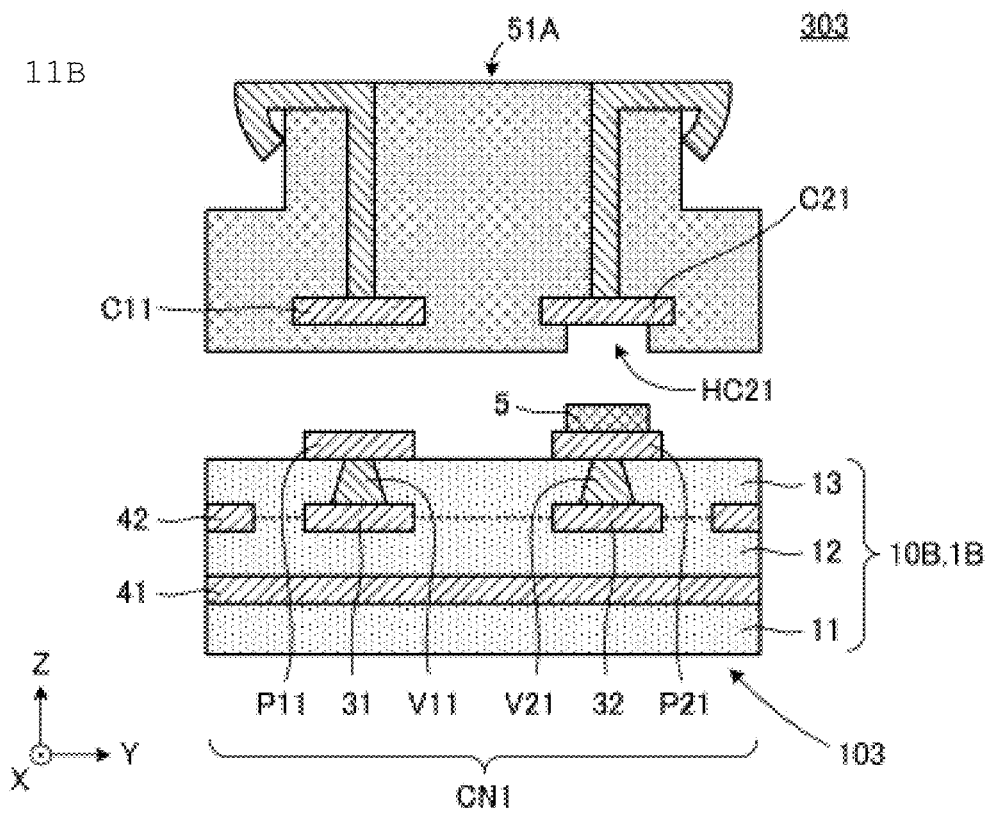
FIG. 11B is a sectional view taken along line C-C indicated in FIG. 9A, in a state where the connector 51A is detached.

FIG. 9A is a perspective view of a connector-equipped cable 303 according to the third preferred embodiment, and FIG. 9B is a perspective view of the connector-equipped cable 303 with connectors 51A and 52A being detached. FIG. 10 is an exploded plan view of a transmission line board 103 according to the third preferred embodiment. FIG. 11A is a sectional view taken along line C-C indicated in FIG. 9A, and FIG. 11B is a sectional view taken along line C-C indicated in FIG. 9A, in a state where the connector 51A is detached. FIG. 10 shows the first signal line 31 and the second signal line 32 that are hatched for easier structure comprehension.

The connector-equipped cable 303 includes the transmission line board 103 and the connectors 51A and 52A.

The transmission line board 103 includes an element assembly 1B, the first signal electrodes P11 and P12, the second signal electrodes P21 and P22, the plurality of ground electrodes PG1 and PG2, the first signal line 31, the second signal line 32, the ground conductors 41 and 42, interlayer connection conductors V11, V12, V21, and V22, the plurality of ground interlayer connection conductors V41 and V42, and the like. The transmission line board 103 is different from the transmission line board 101 according to the first preferred embodiment in that the transmission line board 103 does not include any ground conductor provided on the entire or substantially the entire surface of the substrate layer 13. Furthermore, the transmission line board 103 is different from the transmission line board 101 in that the transmission line board 103 includes no protective layer. The transmission line board 103 is configured the same or substantially similar to the transmission line board 101 in the remaining portions.

Description is provided below of differences from the connector-equipped cable 301 according to the first preferred embodiment.

The element assembly 1B according to the present preferred embodiment corresponds to an insulating substrate 10B. Accordingly, the first principal surface VS1 of the insulating substrate 10B corresponds with the first surface S1 of the element assembly 1B, and the second principal surface VS2 of the insulating substrate 10B corresponds with the second surface S2 of the element assembly 1B.

The first signal electrodes P11 and P12, the second signal electrodes P21 and P22, and the plurality of ground electrodes PG1 and PG2 are provided on the first principal surface VS1 of the insulating substrate 10B. The first signal line 31, the second signal line 32, the ground conductors 41 and 42, the interlayer connection conductors V11, V12, V21, and V22, and the plurality of ground interlayer connection conductors V41 and V42 are provided inside the insulating substrate 10B.

The insulating substrate 10B is formed by stacking the plurality of substrate layers 11 to 13 in the order described above. The plurality of substrate layers 11 to 13 are configured the same as or similar to those according to the first preferred embodiment.

The substrate layer 11 includes a surface provided with the ground conductor 41. The ground conductor 41 is configured the same as or similar to that according to the first preferred embodiment.

The substrate layer 12 is provided, on the surface, with first signal line 31, the second signal line 32, and the ground conductor 42. The first signal line 31, the second signal line 32, and the ground conductor 42 are configured the same as or similar to those according to the first preferred embodiment.

The substrate layer 12 is provided with the plurality of ground interlayer connection conductors V41. The ground conductor 42 is connected to the ground conductor 41 via the plurality of ground interlayer connection conductors V41.

The substrate layer 13 is provided, on the surface, with the first signal electrodes P11 and P12, the second signal electrodes P21 and P22, and the pluralities of ground electrodes PG1 and PG2. The first signal electrode P11, the second signal electrode P21, and the plurality of ground electrodes PG1 are defined by rectangular or substantially rectangular conductor patterns disposed adjacent to the first end of the substrate layer 13 (a left end of the substrate layer 13 in FIG. 10). The first signal electrode P12, the second signal electrode P22, and the plurality of ground electrodes PG2 are defined by rectangular or substantially rectangular conductor patterns disposed adjacent to the second end of the substrate layer 13 (a right end of the substrate layer 13 in FIG. 10).

The substrate layer 13 is provided with the interlayer connection conductors V11, V12, V21, and V22 and the plurality of ground interlayer connection conductors V42. The first signal electrode P11 is connected to the first end of the first signal line 31 (a left end of the first signal line 31 in FIG. 10) via the interlayer connection conductor V11, and the first signal electrode P12 is connected to the second end of the first signal line 31 (a right end of the first signal line 31 in FIG. 10) via the interlayer connection conductor V12. The second signal electrode P21 is connected to the first end of the second signal line 32 (a left end of the second signal line 32 in FIG. 10) via the interlayer connection conductor V21, and the second signal electrode P22 is connected to the second end of the second signal line 32 (a right end of the second signal line 32 in FIG. 10) via the interlayer connection conductor V22. The ground electrodes PG1 are each connected to the ground conductor 42 via a corresponding one of the ground interlayer connection conductors V42. The ground electrodes PG2 are each connected to the ground conductor 42 via a corresponding one of the ground interlayer connection conductors V42.

As shown in FIG. 10, the plurality of ground electrodes PG1 surround the first signal electrode P11 and the second signal electrode P21 in a planar view of the first principal surface (when viewed in the Z axis direction). The plurality of ground electrodes PG2 surround the first signal electrode P12 and the second signal electrode P22 when viewed in the Z axis direction.

The first signal line 31, the ground conductor 41, and the substrate layer 12 interposed between the first signal line 31 and the ground conductor 41 define a first transmission line having a microstripline structure in the present preferred embodiment. The second signal line 32, the ground conductor 41, and the substrate layer 12 interposed between the second signal line 32 and the ground conductor 41 define a second transmission line having a microstripline structure in the present preferred embodiment.

The connector 51A includes the first connection electrode C11, the second connection electrode C21, and the plurality of ground connection electrodes CG1. The first connection electrode C11 and the second connection electrode C21 are buried in a main body of the connector 51A. The first connection electrode C11 is not exposed outside. The connector 51A includes a mount surface (lower surface) provided with (exposing) the second connection electrode C21 and the plurality of ground connection electrodes CG1. Specifically, the mount surface of the connector 51A includes an opening HC21 positionally corresponding to the second connection electrode C21 that is exposed outside via the opening HC21.

The first connection electrode C11 in the connector 51A is disposed opposite to the first signal electrode P11 and is capacitively coupled to the first signal electrode P11. The second connection electrode C21 in the connector 51A is connected to the second signal electrode P21 via the conductive binder 5. The ground connection electrodes CG1 on the connector 51A are each connected to a corresponding one of the ground electrodes PG1 via a conductive binder. The first signal electrode P11 is accordingly connected by capacitive coupling to the connector 51A (first circuit board). The second signal electrode P21 is connected to the connector 51A (first circuit board) via the conductive binder 5.

The connector 52A includes the first connection electrode C12, the second connection electrode C22, and the plurality of ground connection electrodes CG2. The first connection electrode C12 and the second connection electrode C22 are buried in a main body of the connector 52A. The first connection electrode C12 is not exposed outside. The connector 52A includes a mount surface (lower surface) provided with (exposing) the second connection electrode C22 and the plurality of ground connection electrodes CG2. Specifically, the mount surface of the connector 52A includes an opening HC22 positionally corresponding to the second connection electrode C22 that is exposed outside via the opening HC22.

The first connection electrode C12 in the connector 52A is disposed opposite to the first signal electrode P12 and is capacitively coupled to the first signal electrode P12. The second connection electrode C22 in the connector 52A is connected to the second signal electrode P22 via a conductive binder. The ground connection electrodes CG2 on the connector 52A are each connected to a corresponding one of the ground electrodes PG2 via a conductive binder. The first signal electrode P12 is accordingly connected by capacitive coupling to the connector 52A (second circuit board). The second signal electrode P22 is connected to the connector 52A (second circuit board) via a conductive binder.

In this manner, the first connection electrodes C11 and C12 may not be provided on the mount surface of the connector.

The present preferred embodiment exemplifies the transmission line board including no protective layer, although the transmission line board may alternatively include a protective layer as in the transmission line board according to any one of the other preferred embodiments.

Fourth Preferred Embodiment

A fourth preferred embodiment of the present invention exemplifies a case where the insulating substrate includes a single layer.

Figure 12A:
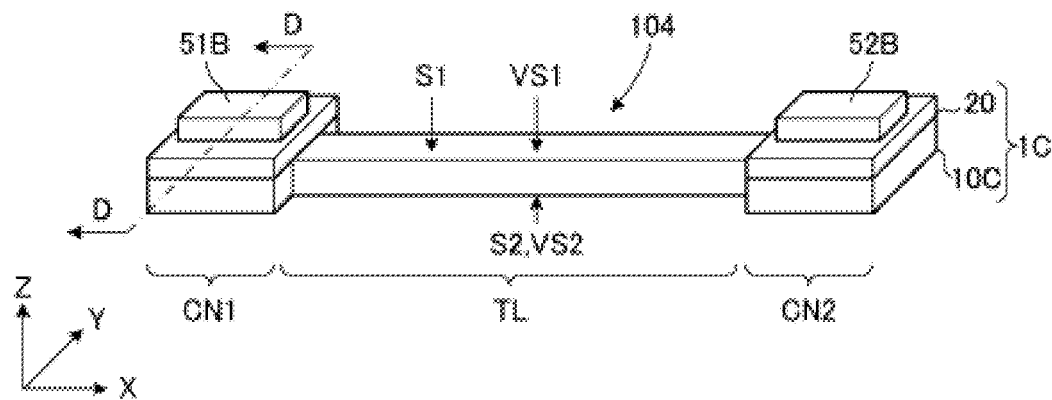
FIG. 12A is a perspective view of a connector-equipped cable 304 according to a fourth preferred embodiment of the present invention.
Figure 12B:
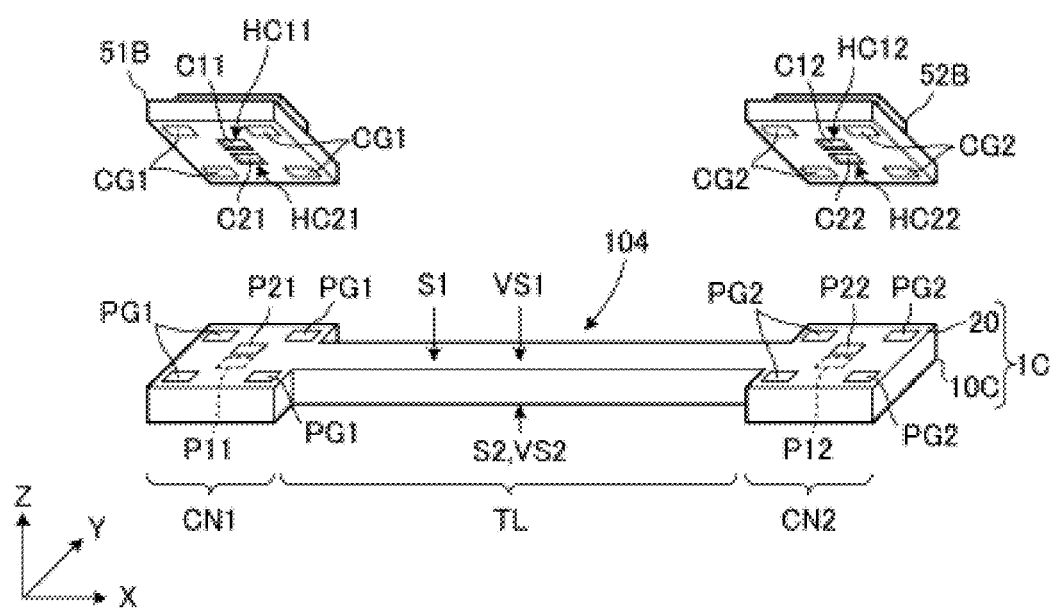
FIG. 12B is a perspective view of the connector-equipped cable 304 with connectors 51B and 52B being detached.
Figure 13:
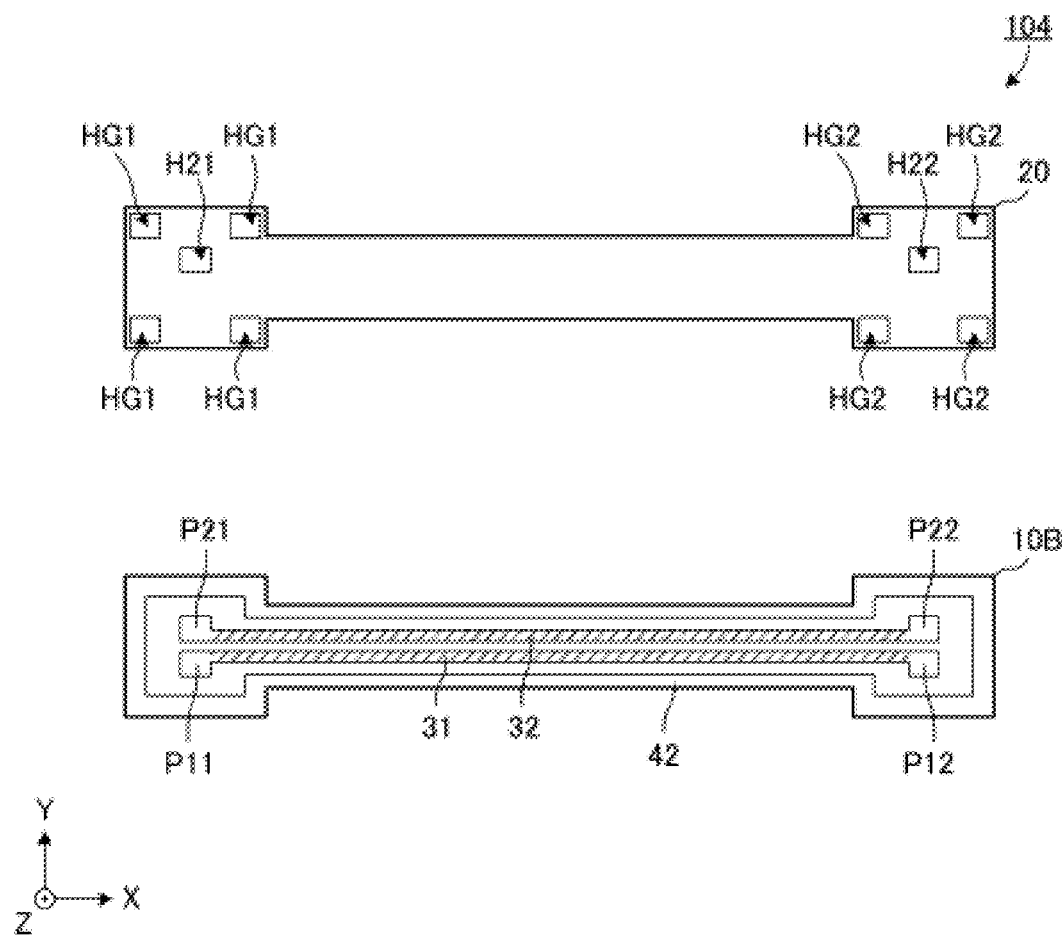
FIG. 13 is an exploded plan view of a transmission line board 104 according to the fourth preferred embodiment of the present invention.
Figure 14:
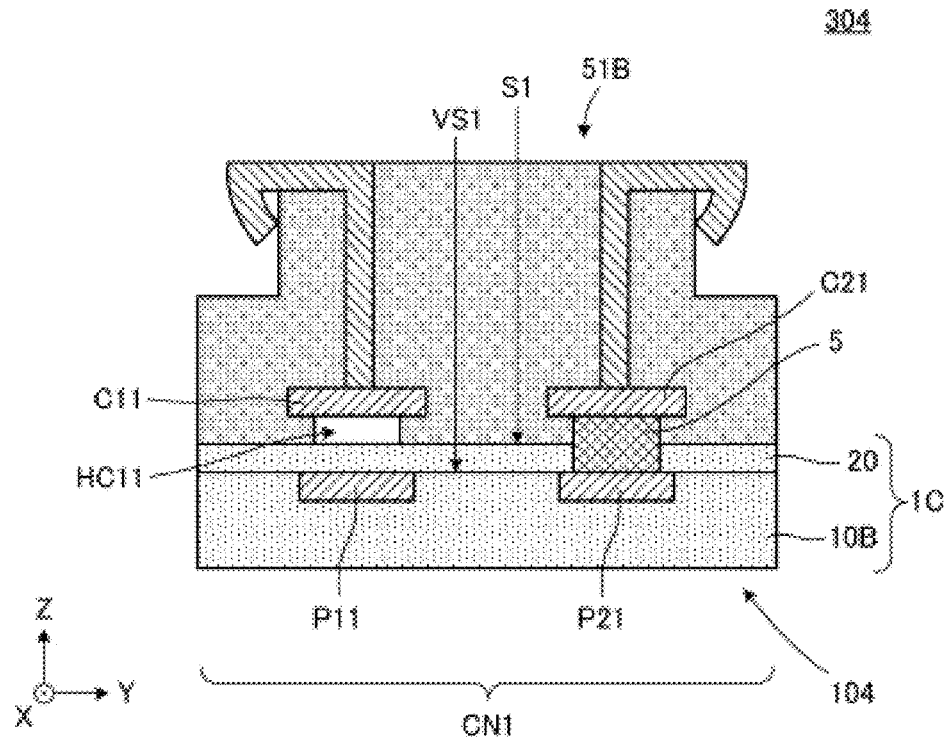
FIG. 14 is a sectional view taken along line D-D indicated in FIG. 12A.

FIG. 12A is a perspective view of a connector-equipped cable 304 according to the fourth preferred embodiment, and FIG. 12B is a perspective view of the connector-equipped cable 304 with connectors 51B and 52B being detached. FIG. 13 is an exploded plan view of a transmission line board 104 according to the fourth preferred embodiment. FIG. 14 is a sectional view taken along line D-D indicated in FIG. 12A. FIG. 13 shows the first signal line 31 and the second signal line 32 that are hatched for easier structure comprehension.

The connector-equipped cable 304 includes the transmission line board 104 and the connectors 51B and 52B. The transmission line board 104 is different from the transmission line board 101 according to the first preferred embodiment in that the transmission line board 104 includes an insulating substrate 10C including a single layer. The transmission line board 104 is configured the same or substantially similar to the transmission line board 101 in the remaining portions.

Description is provided below of differences from the connector-equipped cable 301 according to the first preferred embodiment.

The transmission line board 104 includes an element assembly 1C including a stack of the insulating substrate 10C and the protective layer 20. The insulating substrate 10C includes the second principal surface VS2 corresponding to the second surface S2 of the element assembly 1C in the present preferred embodiment.

The first signal electrodes P11 and P12, the second signal electrodes P21 and P22, the first signal line 31, the second signal line 32, and the plurality of ground electrodes PG1 and PG2 are provided on the first principal surface VS1 of the insulating substrate 10C. The first signal electrode P11 is connected to the first end of the first signal line 31 (a left end of the first signal line 31 in FIG. 13), and the first signal electrode P12 is connected to the second end of the first signal line 31 (a right end of the first signal line 31 in FIG. 13). The second signal electrode P21 is connected to the first end of the second signal line 32 (a left end of the second signal line 32 in FIG. 13), and the second signal electrode P22 is connected to the second end of the second signal line 32 (a right end of the second signal line 32 in FIG. 13). The ground conductor 42 is defined by an annular conductor pattern provided along an outer periphery of the insulating substrate 10C.

The protective layer 20 is a protective film stacked on the first principal surface VS1 of the insulating substrate 10C, and has the same or substantially similar planar shape to the insulating substrate 10C. The protective layer 20 includes the openings H21, H22, HG1, and HG2. The opening H21 positionally corresponds to the second signal electrode P21, and the opening H22 positionally corresponds to the second signal electrode P22. When the protective layer 20 is provided on the first principal surface VS1 of the insulating substrate 10C, the second signal electrodes P21 and P22 are exposed outside via the openings. A plurality of openings HG1 are provided adjacent to the first end of the protective layer 20 (a left end of the protective layer 20 in FIG. 13), and a plurality of openings HG2 are provided adjacent to the second end of the protective layer 20 (a right end of the protective layer 20 in FIG. 13). When the protective layer 20 is provided on the first principal surface VS1 of the insulating substrate 10C, a portion of the ground conductor 42 is exposed outside via the openings HG1 and HG2. In the present preferred embodiment, a portion of the ground conductor 42 exposed through the openings HG1 and HG2 corresponds to the "ground electrodes (PG1 and PG2)".

The connector 51B includes the first connection electrode C11, the second connection electrode C21, and the plurality of ground connection electrodes CG1. The first connection electrode C11 and the second connection electrode C21 are buried in a main body of the connector 51B. The connector 51B includes a mount surface (lower surface) provided with (exposing) the first connection electrode C11, the second connection electrode C21, and the plurality of ground connection electrodes CG1. Specifically, the mount surface of the connector 51B includes an opening HC11 positionally corresponding to the first connection electrode C11 that is exposed outside via the opening HC11. Furthermore, the mount surface of the connector 51B includes the opening HC21 positionally corresponding to the second connection electrode C21 that is exposed outside via the opening HC21.

The connector 52B includes the first connection electrode C12, the second connection electrode C22, and the plurality of ground connection electrodes CG2. The first connection electrode C12 and the second connection electrode C22 are buried in a main body of the connector 52B. The connector 52B includes a mount surface (lower surface) provided with (exposing) the first connection electrode C12, the second connection electrode C22, and the plurality of ground connection electrodes CG2. Specifically, the mount surface of the connector 52B includes an opening HC12 positionally corresponding to the first connection electrode C12 that is exposed outside via the opening HC12. Furthermore, the mount surface of the connector 52B includes the opening HC22 positionally corresponding to the second connection electrode C22 that is exposed outside via the opening HC22.

As shown in FIG. 14, the first signal electrode P11 and the first connection electrode C11 interpose a cavity (a recess provided by the opening HC11). Although not shown, the first signal electrode P12 and the first connection electrode C12 also interpose a cavity (a recess provided by the opening HC12). These cavities according to the present preferred embodiment correspond to the "capacitance adjuster".

This configuration enables adjustment of capacitance between the first signal electrode and the first connection electrode by changing a shape or the like of the opening provided in the mount surface of the connector.

Fifth Preferred Embodiment

A fifth preferred embodiment of the present invention exemplarily provides a connector-equipped cable including a connector having a different structure.

Figure 15:
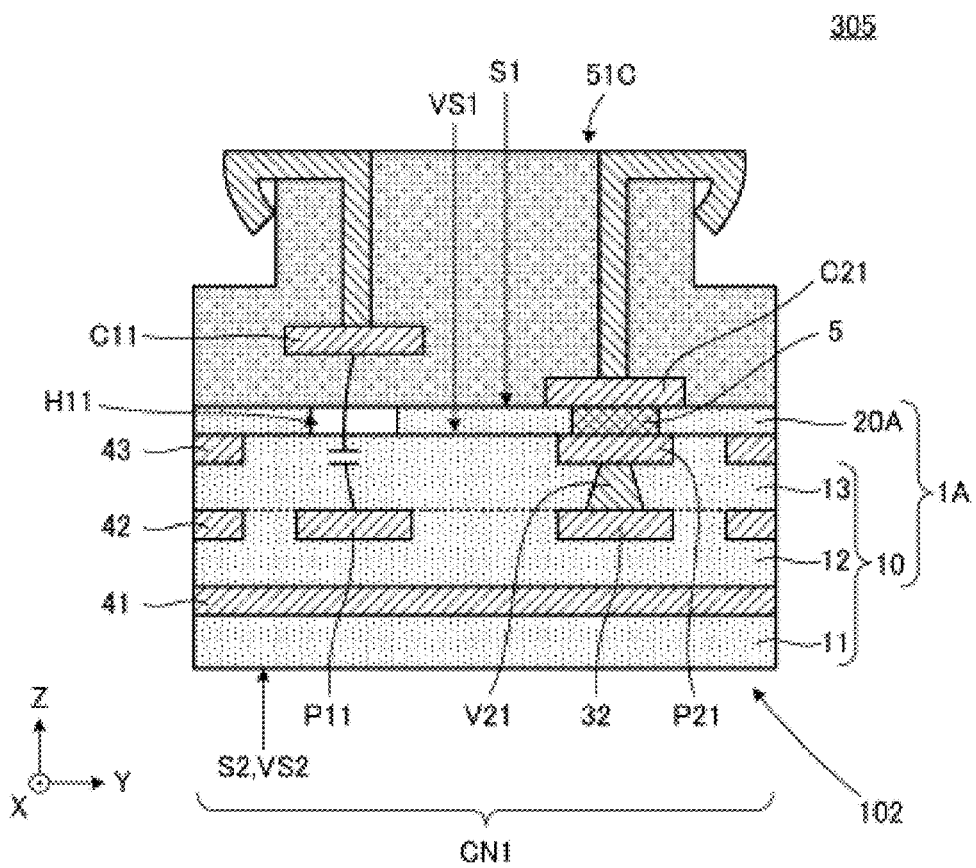
FIG. 15 is a sectional view of a connector-equipped cable 305 according to a fifth preferred embodiment of the present invention.

FIG. 15 is a sectional view of a connector-equipped cable 305 according to the fifth preferred embodiment. More specifically, FIG. 15 is a sectional view of the transmission line board 102 at the first connection portion CN1 in a state where the connector is mounted in the connector-equipped cable 305.

The connector-equipped cable 305 is different from the connector-equipped cable 302 according to the second preferred embodiment in that the connector-equipped cable 305 includes a connector 51C. The connector-equipped cable 305 is configured the same as or similar to the connector-equipped cable 302 in the remaining portions.

Description is provided below of differences from the connector-equipped cable 302 according to the second preferred embodiment.

The connector 51C includes the first connection electrode C11, the second connection electrode C21, and the like. The first connection electrode C11 is buried in a main body of the connector 51C. The connector 51C includes a mount surface (lower surface) provided with (exposing) the second connection electrode C21.

In this manner, only the first connection electrode C11 may be buried in the main body of the connector 51C.

The present preferred embodiment exemplifies the transmission line board 102 including the protective layer 20A provided with the opening H11, but the present invention should not be limited to this configuration. The present invention does not necessarily include the cavity provided between first signal electrode P11 and the first connection electrode C11. In other words, the opening provided in the protective layer and positionally corresponding to the first signal electrode is not a necessary configuration.

Sixth Preferred Embodiment

A sixth preferred embodiment of the present invention exemplifies a case where a transmission line board is surface mounted on a single circuit board.

Figure 16A:
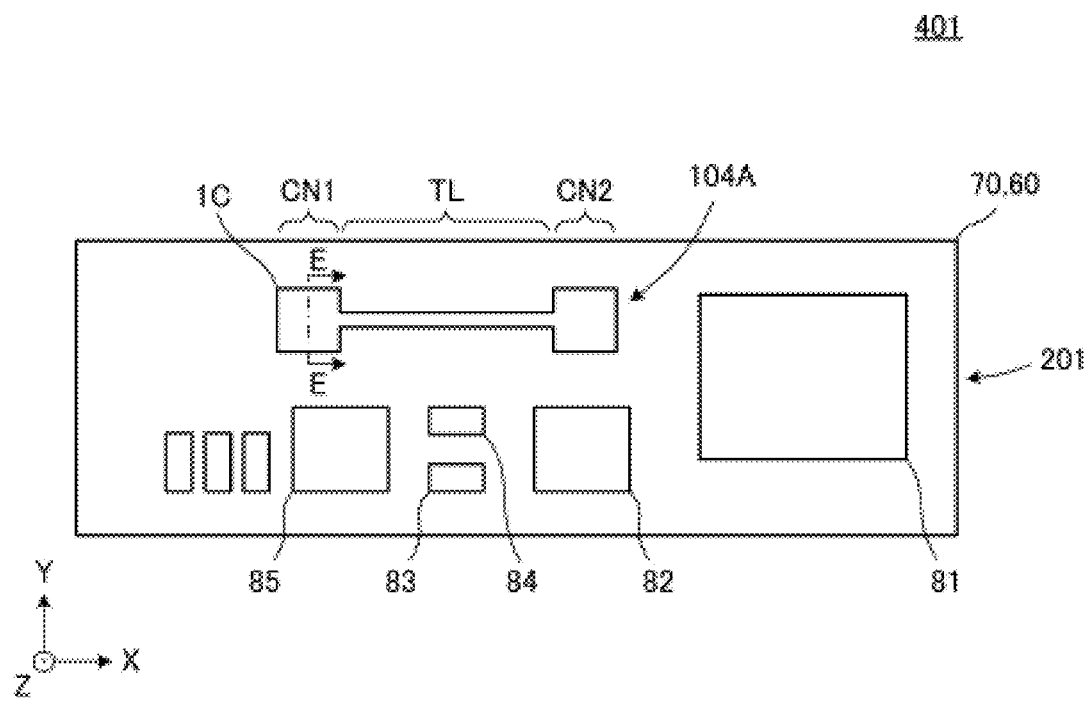
FIG. 16A is a plan view of a principal portion of an electronic device 401 according to a sixth preferred embodiment of the present invention.
Figure 16B:
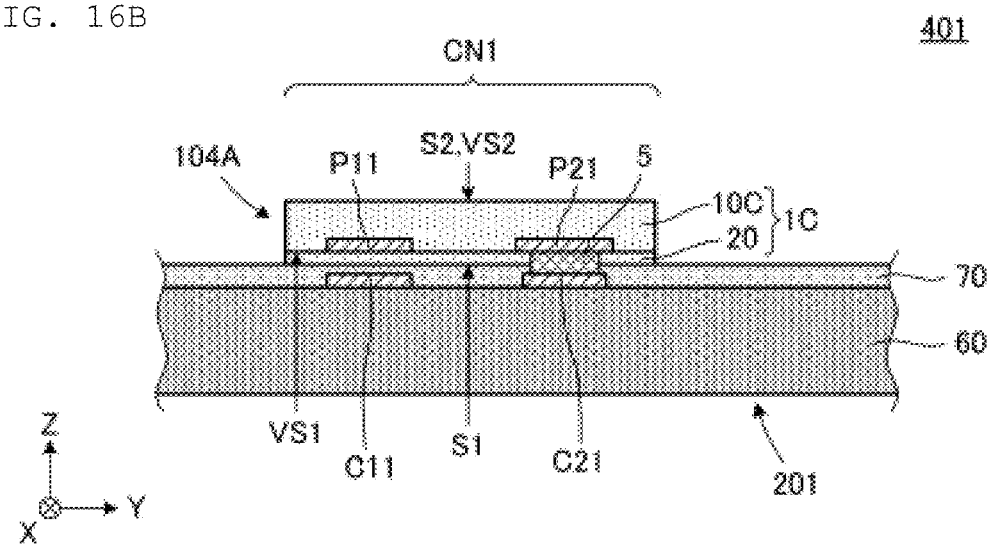
FIG. 16B is a sectional view taken along line E-E indicated in FIG. 16A.

FIG. 16A is a plan view of a principal portion of an electronic device 401 according to the sixth preferred embodiment, and FIG. 16B is a sectional view taken along line E-E indicated in FIG. 16A.

The electronic device 401 includes a transmission line board 104A, a circuit board 201, and the like. The transmission line board 104A is different from the transmission line board 104 according to the fourth preferred embodiment in that the transmission line board 104A does not include the connectors 51B or 52B. The transmission line board 104A is configured the same as or similar to the transmission line board 104 in the remaining portions.

The circuit board 201 includes an insulating substrate 60 and a protective layer 70. The protective layer 70 is a protective film provided on the entire or substantially the entire surface (upper surface) of the insulating substrate 60. The surface of the insulating substrate 60 is provided with the first connection electrode C11, the second connection electrode C21, and a plurality of ground electrodes (not shown). Examples of the insulating substrate 60 include a glass epoxy board, and examples of the protective layer 70 include a cover lay film, a solder resist film, and an epoxy resin film.

The transmission line board 104A is joined to the circuit board 201 with a conductive binder interposed therebetween. As shown in FIG. 16B, the transmission line board 104A includes the first signal electrode P11 disposed opposite to the first connection electrode C11 at the circuit board 201 and connected by capacitive coupling to the circuit board 201. The transmission line board 104A includes the second signal electrode P21 connected directly to the second connection electrode C21 at the circuit board 201 via the conductive binder 5. The transmission line board 104A includes a ground electrode connected directly to the ground connection electrode at the circuit board 201 via a conductive binder. Although not shown, the same applies to the second connection portion CN2.

In this manner, the first signal electrode at the transmission line board 104A is connected by capacitive coupling to the circuit board 201, and the second signal electrode at the transmission line board 104A is connected directly to the circuit board 201 via the conductive binder.

As shown in FIG. 16A, the circuit board 201 includes an upper surface provided with a plurality of mounted components 81 to 85 along with the transmission line board 104A. Examples of the mounted components 81 to 85 include a chip component, such as a chip inductor and a chip capacitor.

Seventh Preferred Embodiment

A seventh preferred embodiment of the present invention exemplifies a transmission line board including a ground electrode (or a ground interlayer connection conductor) disposed between a first signal electrode and a second signal electrode at a connection portion.

Figure 17A:
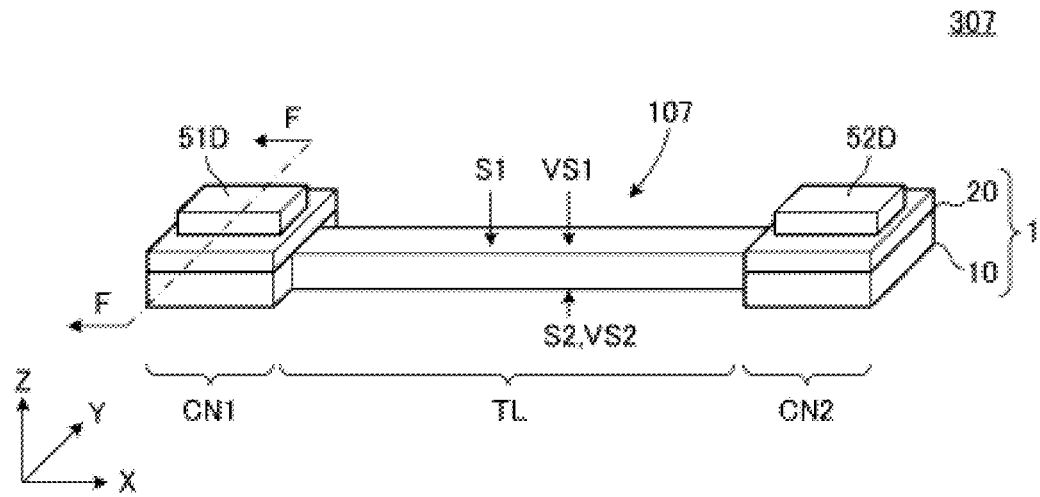
FIG. 17A is a perspective view of a connector-equipped cable 307 according to a seventh preferred embodiment.
Figure 17B:
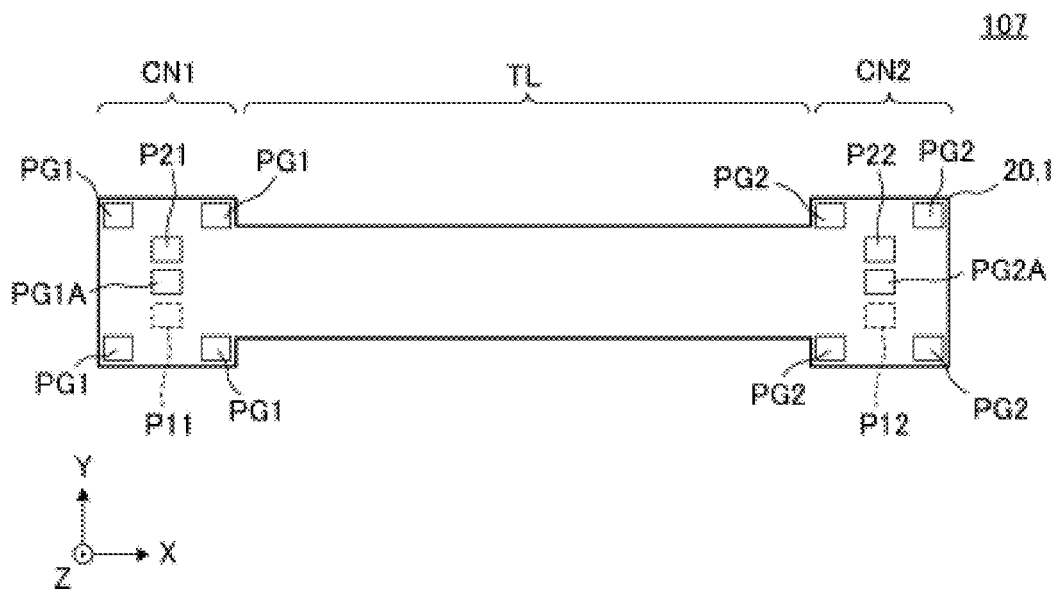
FIG. 17B is a plan view of a transmission line board 107 according to the seventh preferred embodiment of the present invention.
Figure 18:
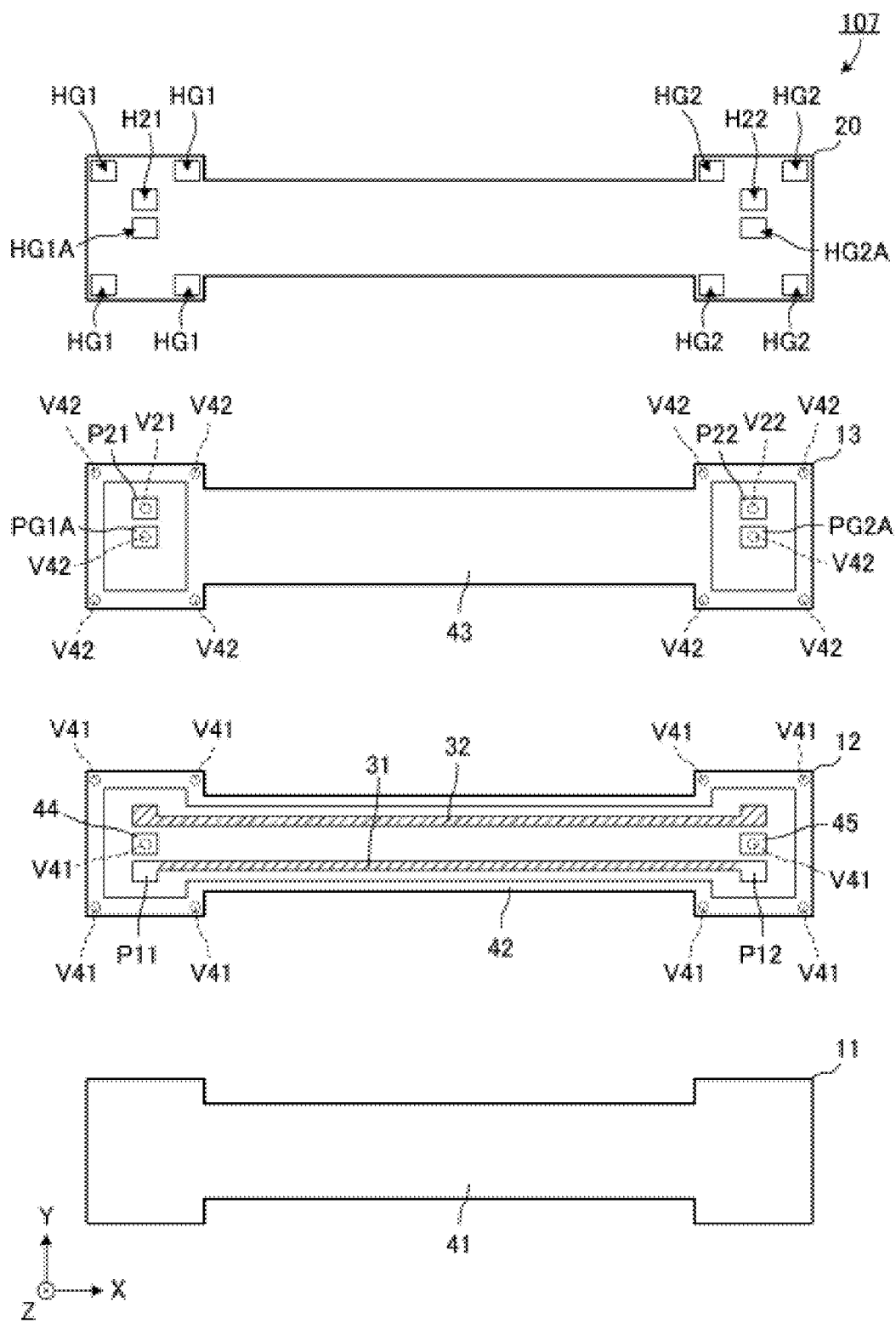
FIG. 18 is an exploded plan view of the transmission line board 107.
Figure 19:
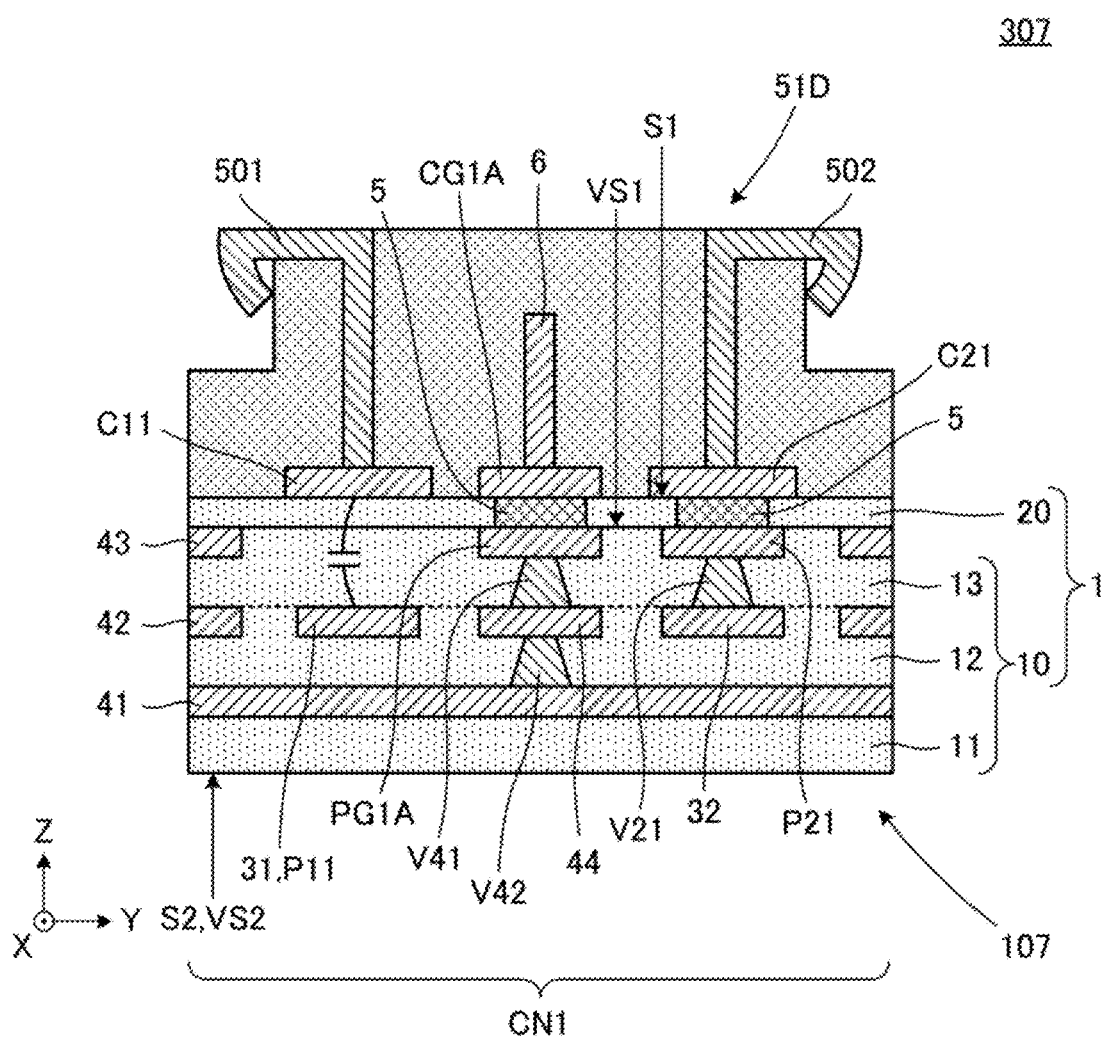
FIG. 19 is a sectional view taken along line F-F indicated in FIG. 17A.

FIG. 17A is a perspective view of a connector-equipped cable 307 according to the seventh preferred embodiment, and FIG. 17B is a plan view of a transmission line board 107 according to the seventh preferred embodiment. FIG. 18 is an exploded plan view of the transmission line board 107. FIG. 19 is a sectional view taken along line F-F indicated in FIG. 17A. FIG. 18 shows the first signal line 31 and the second signal line 32 that are hatched for easier structure comprehension.

The connector-equipped cable 307 is different from the connector-equipped cable 301 according to the first preferred embodiment in that the connector-equipped cable 307 includes the transmission line board 107 and connectors 51D and 52D. Description is provided below of differences from the connector-equipped cable 301.

The transmission line board 107 is different from the transmission line board 101 according to the first preferred embodiment in that the transmission line board 107 includes intermediate ground electrodes PG1A and PG2A provided on the first principal surface VS1, and intermediate ground conductors 44 and 45 provided inside the insulating substrate 10. The transmission line board 107 is configured the same as or substantially similar to the transmission line board 101 in the remaining portions.

The intermediate ground electrode PG1A and the intermediate ground conductor 44 are disposed between the first signal electrode P11 and the second signal electrode P21 at the first connection portion CN1 in a planar view of the first principal surface VS1 (when viewed in the Z axis direction). The intermediate ground electrode PG2A and the intermediate ground conductor 45 are disposed between the first signal electrode P12 and the second signal electrode P22 at the second connection portion CN2 when viewed in the Z axis direction.

The connector 51D is different from the connector 51 according to the first preferred embodiment in that the connector 51D includes a shield member 6 and an intermediate ground connection electrode CG1A. The shield member 6 is a rectangular or substantially rectangular sheet conductor provided inside the connector 51D, and has an elongated shape with a longitudinal direction extending in the X axis direction. The intermediate ground connection electrode CG1A is provided on a mount surface (lower surface) of the connector 51D. As shown in FIG. 19, the shield member 6 and the intermediate ground connection electrode CG1A are disposed between the first connection electrode C11 and the second connection electrode C21 when viewed in the Z axis direction. Although not shown, the connector 52D is similarly configured.

The intermediate ground electrode PG1A on the transmission line board 107 is connected to the intermediate ground connection electrode CG1A at the connector 51D via the conductive binder 5. The intermediate ground connection electrode CG1A is connected to the shield member 6. As shown in FIG. 19, the shield member 6 is connected to the ground conductor 41 via the intermediate ground connection electrode CG1A, the conductive binder 5, the intermediate ground electrode PG1A, the intermediate ground conductor 44, and the ground interlayer connection conductors V41 and V42.

In the present preferred embodiment, the ground electrode PG1, the intermediate ground conductor 44, and the ground interlayer connection conductors V41 and V42 are disposed between the first signal electrode P11 and the second signal electrode P21 when viewed in the Z axis direction. This configuration can reduce or prevent positional displacement of the signal electrodes (the first signal electrode P11 and the second signal electrode P21) due to a resin flow during hot pressing, and can also reduce or prevent impedance change due to the positional displacement of the signal electrodes.

In the present preferred embodiment, a first signal conductor (a conductor electrically connected to the first signal line 31) and a second signal conductor (a conductor electrically connected to the second signal line) at the first connection portion CN1 interpose a ground (the intermediate ground electrode PG1A, the intermediate ground conductor 44, the ground interlayer connection conductors V41 and V42, the intermediate ground connection electrode CG1A, and the shield member 6). This configuration ensures isolation between the first signal conductor and the second signal conductor at the first connection portion CN1 by the ground disposed between the first signal conductor and the second signal conductor, and inhibits crosstalk between the first signal conductor and the second signal conductor. The same applies to the second connection portion CN2.

The present preferred embodiment exemplifies the shield member 6 as the sheet conductor having the elongated shape with the longitudinal direction extending the X axis direction, but the shield member 6 is not limited to this shape. The shield member 6 can be changed in terms of its number, the shape, or the like, for example. Examples of the shape of the shield member 6 include a columnar shape and a prismatic shape. The shield member 6 is positioned between a connector first inner terminal 501 connected to the first connection electrode C11 and a contact portion with a fitting target included in a connector second inner terminal 502 connected to the second connection portion CN2, and is overlapped, when viewed in the Y axis direction, with a contact portion of the connector first inner terminal 501 and the contact portion of the connector second inner terminal 502.

The present preferred embodiment exemplifies the case where the transmission line board includes the connectors 51D and 52D each including the intermediate ground connection electrode CG1A and the shield member 6. When the transmission line board is surface mounted on a single circuit board, the circuit board may alternatively include the intermediate ground connection electrode CG1A and the shield member 6.

Each of the preferred embodiments described above exemplifies the transmission line board including the first connection portion CN1, the second connection portion CN2, and the line portion TL, but each of the connection portions and the line portion included in the transmission line board can be appropriately changed in the number thereof within the scope achieving the advantageous functions and effects of the present invention.

Each of the preferred embodiments described above exemplifies the case where the insulating substrate is a flat plate having a rectangular or substantially rectangular shape, but the present invention is not limited to this configuration. The shape of the insulating substrate can be appropriately changed within the scope achieving the advantageous functions and effects of the present invention. The insulating substrate may have a planar shape such as an L shape, a crank shape, a T shape, a Y shape, or a U shape, for example.

The first to third and fifth preferred embodiments each exemplify the case where the insulating substrate is a stack obtained by stacking the three substrate layers, but the insulating substrate according to the present invention is not limited in terms of the number of stacked layers. The number of the substrate layers of the insulating substrate can be appropriately changed within the scope achieving the advantageous functions and effects of preferred embodiments of the present invention.

The above preferred embodiments each exemplify the case where the insulating substrate is a flat plate mainly made of a thermoplastic resin, but the present invention is not limited to this configuration. The insulating substrate may alternatively be a flat plate mainly made of a thermosetting resin, for example. The insulating substrate may still alternatively be a dielectric ceramic, such as low temperature co-fired ceramics (LTCC), for example. The insulating substrate may still alternatively be a composite stack of a plurality of resins, and may exemplarily include a thermosetting resin sheet, such as a glass epoxy board and a thermoplastic sheet stacked together, for example. The insulating substrate does not necessarily include a plurality of substrate layers with surfaces that are hot pressed (collectively pressed) to be fusion bonded, and may alternatively include an adhesive layer disposed between the substrate layers.

The circuit provided on the transmission line board is not limited in terms of its configuration according to any one of the above-described preferred embodiments, and can be appropriately changed within the scope achieving the advantageous functions and effects of preferred embodiments of the present invention. For example, the circuit provided on the transmission line board may include a coil defined by a conductor pattern, a capacitor defined by a conductor pattern, a frequency filter such as any one of various filters (a low-pass filter, a high-pass filter, a band-pass filter, and a band-elimination filter). The transmission line board may be provided with any of various different transmission lines (e.g. a meandering transmission line and a coplanar transmission line). The transmission line board may further have various electronic components, such as, for example, a chip component mounted thereon or buried therein.

The above-described preferred embodiments each exemplify the transmission line board provided with the two transmission lines (the first transmission line and the second transmission line), but the present invention is not limited to this configuration. The number of the transmission lines can be appropriately changed in accordance with the configuration of the circuit provided on the transmission line board, and can be three or more. For example, the transmission line board may include a plurality (the number of the second transmission lines) of second signal lines. In this case, the plurality of second transmission lines may be applied to an identical system (in an identical frequency band), or may be applied to different systems (in different frequency bands).

The above preferred embodiments exemplify the electrodes (the first signal electrodes P11 and P12, the second signal electrodes P21 and P22, the first connection electrodes C11 and C12, the second connection electrodes C21 and C22, and the pluralities of ground electrodes PG1 and PG2) each having a rectangular or substantially rectangular planar shape, but the present invention is not limited to this shape. The planar shape of each of the electrodes can be appropriately changed within the scope achieving the advantageous functions and effects of the present invention, and examples thereof include a polygonal shape, a circular shape, an elliptical shape, an arc shape, a ring shape, an L shape, a U shape, a T shape, a Y shape, and a crank shape. Each type of the electrodes can be appropriately changed in terms of its number and its position within the scope achieving the advantageous functions and effects of preferred embodiments of the present invention. The transmission line board may alternatively include, in addition to these electrodes, a dummy electrode not connected to the circuit, or the like.

The above preferred embodiments each exemplify the case where the first signal line 31 and the second signal line 32 are provided at the same or substantially the same layer level in the insulating substrate, but the present invention is not be to this configuration. The first signal line 31 and the second signal line 32 may alternatively be provided at different layer levels in a thickness direction (the Z axis direction). In this case, the first signal line 31 for the first frequency band is preferably disposed closer to the first principal surface VS1 than the second signal line. This configuration achieves a reduction in line length of the first signal line 31 (first transmission line) for the first frequency band higher than the second frequency band, for effective reduction or prevention of conductor loss.

The above preferred embodiments each exemplify the configuration in which the first connection electrode C11 has an area larger than that of the first signal electrode P11, but the present invention is not limited to this configuration. Preferred embodiments of the present invention achieve similar advantageous functions and effects even in an exemplary case where the first signal electrode P11 has a larger area than the first connection electrode C11. That is, when any one of the first signal electrode and the first connection electrode has a larger area than the other one, a change in capacitance generated between the first signal electrode and the first connection electrode is reduced or prevented even if the first signal electrode and the first connection electrode are positionally displaced from each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A transmission line board comprising:
an insulating substrate including a first principal surface;
a first signal line and at least one second signal line provided at the insulating substrate;
a first signal electrode provided at the insulating substrate, connected to the first signal line, and connected by capacitive coupling to a different circuit board; and
a second signal electrode provided at the first principal surface, connected to the second signal line, and connected to the different circuit board via a conductive binder; wherein
the first signal line is provided to transmit a signal in a first frequency band; and
the second signal line is provided to transmit a signal in a second frequency band lower than a signal in the first frequency band.

2. The transmission line board according to claim 1, further comprising:
a plurality of ground electrodes disposed at the first principal surface; wherein
the plurality of ground electrodes surround the first signal electrode and the second signal electrode in a planar view of the first principal surface.

3. The transmission line board according to claim 1, wherein the first signal line is connected to the first signal electrode via no interlayer connection conductor.

4. The transmission line board according to claim 1, wherein the first signal line, the second signal line, and the first signal electrode are not exposed outside of the transmission line board.

5. The transmission line board according to claim 4, wherein
the insulating substrate is mainly made of a liquid crystal polymer; and an entirety or substantially an entirety of the first signal line, an entirety or substantially an entirety of the second signal line, and an entirety or substantially an entirety of the first signal electrode are covered with the insulating substrate.

6. The transmission line board according to claim 1, wherein the at least one second signal line includes a plurality of second signal lines.

7. The transmission line board according to claim 1, further comprising:
a ground conductor provided at a second principal surface of the insulating substrate; and
the ground conductor overlaps with both of the first signal electrode and the second signal electrode when viewed in a plan view of the transmission line board.

8. The transmission line board according to claim 1, wherein no electrode to connect the transmission line board to the different circuit board overlaps with the first signal electrode when view in a plan view of the transmission line board.

9. A joint structure of a transmission line board, the joint structure comprising:
the transmission line board; and
a circuit board joined to the transmission line board with a conductive binder interposed therebetween; wherein
the transmission line board includes:
an insulating substrate including a first principal surface,
a first signal line and at least one second signal line provided at the insulating substrate;
a first signal electrode provided at the insulating substrate and connected to the first signal line; and
a second signal electrode provided at the first principal surface and connected to the second signal line;
the first signal line is provided to transmit a signal in a first frequency band;
the second signal line is provided to transmit a signal in a second frequency band lower than the first frequency band;
the first signal electrode is connected by capacitive coupling to the circuit board; and
the second signal electrode is connected directly to the circuit board via a conductive binder.

10. The joint structure of the transmission line board according to claim 9, wherein
the transmission line board further includes a plurality of ground electrodes disposed at the first principal surface;
the plurality of ground electrodes surround the first signal electrode and the second signal electrode in a planar view of the first principal surface; and
each of the plurality of ground electrodes is connected directly to the circuit board via a conductive binder.

11. The joint structure of the transmission line board according to claim 9, wherein the first signal line is connected to the first signal electrode via no interlayer connection conductor.

12. The joint structure of the transmission line board according to claim 9, wherein the first signal line, the second signal line, and the first signal electrode are not exposed outside the transmission line board.

13. The joint structure of the transmission line board according to claim 12, wherein
the insulating substrate is mainly made of a liquid crystal polymer; and
an entirety or substantially an entirety of the first signal line, an entirety or substantially an entirety of the second signal line, and an entirety or substantially an entirety of the first signal electrode are covered with the insulating substrate.

14. The joint structure of the transmission line board according to claim 9, wherein
the circuit board further includes a first connection electrode opposing and connected by capacitive coupling to the first signal electrode, and a second connection electrode connected directly to the second signal electrode via a conductive binder; and
the transmission line board is surface mounted on the circuit board.

15. The joint structure of the transmission line board according to claim 14, wherein one of the first signal electrode and the first connection electrode has a larger area than another one of the first signal electrode and the first connection electrode.

16. The joint structure of the transmission line board according to claim 14, wherein the first signal electrode and the first connection electrode interpose a capacitance adjuster.

17. The joint structure of the transmission line board according to claim 16, wherein the capacitance adjuster is defined by a cavity.

18. The joint structure of the transmission line board according to claim 14, wherein
the transmission line board further includes an intermediate ground electrode provided at the first principal surface, and a ground interlayer connection conductor provided at the insulating substrate layer and connected to the intermediate ground electrode;
the intermediate ground electrode is disposed between the first signal electrode and the second signal electrode in a planar view of the first principal surface; and
the circuit board includes an intermediate ground connection electrode connected directly to the intermediate ground electrode via a conductive binder.

19. The joint structure of the transmission line board according to claim 18, wherein
the circuit board includes a connector;
the connector includes a connector first inner terminal, a connector second inner terminal, and a shield;
the connector first inner terminal includes an end connected to the first connection electrode;
the connector second inner terminal includes an end connected to the second connection electrode; and
the shield is connected to the intermediate ground electrode.

20. The joint structure of the transmission line board according to claim 14, wherein a distance between the first signal electrode and the first connection electrode is less than a distance between the second signal electrode and the second connection electrode.

21. The joint structure of the transmission line board according to claim 9, wherein the at least one second signal line includes a plurality of second signal lines.

22. The joint structure of the transmission line board according to claim 9, wherein
the transmission line board includes a ground conductor at a second principal surface of the insulating substrate; and
the ground conductor overlaps with both of the first signal electrode and the second signal electrode when viewed in a plan view of the transmission line board.

23. The joint structure of the transmission line board according to claim 9, wherein no electrode connecting the transmission line board to the circuit board overlaps with the first signal electrode when view in a plan view of the transmission line board.

24. A transmission line board comprising:
- an insulating substrate including a first principal surface;
- a first signal line and at least one second signal line provided at the insulating substrate;
- a first signal electrode provided at the insulating substrate, connected to the first signal line, and connected by capacitive coupling to a different circuit board;
- a second signal electrode provided at the first principal surface, connected to the second signal line, and connected to the different circuit board via a conductive binder; and
- a protective layer provided on the insulating substrate; wherein
- the first signal electrode is capacitively coupled to the different circuit board via at least one of the insulating substrate and the protective layer.

25. The transmission line board according to claim 24, wherein the first signal electrode is capacitively coupled to the different circuit board via both of the insulating substrate and the protective layer.

26. The transmission line board according to claim 24, wherein
- the protective layer includes an opening; and
- the first signal electrode is capacitively coupled to the different circuit board via the insulating substrate and the opening of the protective layer.

27. The transmission line board according to claim 24, wherein the first signal electrode is provided on the first principal surface of the insulating substrate and is capacitively coupled to the different circuit board via the protective layer.

28. The transmission line board according to claim 24, further comprising:
- a ground conductor provided at a second principal surface of the insulating substrate; and
- the ground conductor overlaps with both of the first signal electrode and the second signal electrode when viewed in a plan view of the transmission line board.

29. The transmission line board according to claim 24, wherein no electrode to connect the transmission line board to the different circuit board overlaps with the first signal electrode when view in a plan view of the transmission line board.

* * * * *